United States Patent
Sako et al.

(10) Patent No.: US 7,151,733 B2
(45) Date of Patent: Dec. 19, 2006

(54) DATA RECORDING MEDIUM, DATA RECORDING METHOD AND APPARATUS, AND DATA REPRODUCING METHOD AND APPARATUS

(75) Inventors: Yoichiro Sako, Tokyo (JP); Tatsuya Inokuchi, Tokyo (JP); Shunsuke Furukawa, Tokyo (JP); Takashi Kihara, Tokyo (JP)

(73) Assignee: Sony Corporation, Tokyo (JP)

( * ) Notice: Subject to any disclaimer, the term of this patent is extended or adjusted under 35 U.S.C. 154(b) by 273 days.

(21) Appl. No.: 10/467,339

(22) PCT Filed: Dec. 19, 2002

(86) PCT No.: PCT/JP02/13301

§ 371 (c)(1),
(2), (4) Date: Aug. 21, 2003

(87) PCT Pub. No.: WO03/054882

PCT Pub. Date: Jul. 3, 2003

(65) Prior Publication Data

US 2004/0073852 A1    Apr. 15, 2004

(30) Foreign Application Priority Data

Dec. 21, 2001  (JP) .............................. 2001-389750

(51) Int. Cl.
*G11B 7/00*    (2006.01)

(52) U.S. Cl. .............. 369/59.24; 369/47.19; 369/47.21

(58) Field of Classification Search ............. 369/59.26, 369/47.19, 47.21
See application file for complete search history.

(56) References Cited

U.S. PATENT DOCUMENTS

| 5,684,768 | A | * | 11/1997 | Terasaki et al. | ......... 369/47.21 |
| 5,841,749 | A | * | 11/1998 | Sako | ....................... 369/59.26 |
| 6,134,201 | A | * | 10/2000 | Sako et al. | ............... 369/47.19 |
| 6,144,743 | A | | 11/2000 | Yamada et al. | |
| 2004/0073852 | A1 | | 4/2004 | Sako et al. | |

FOREIGN PATENT DOCUMENTS

| EP | 0 743 642 | 11/1996 |
| EP | 743642 | 11/1996 |
| EP | 0 745 994 | 12/1996 |
| EP | 1 020 856 | 7/2000 |
| EP | 1107234 | 6/2001 |
| EP | 1 143 443 | 10/2001 |
| EP | 1 143 655 | 10/2001 |
| EP | 1 148 488 | 10/2001 |
| JP | 7-211014 | 8/1995 |
| JP | 2000-276852 | 10/2000 |

OTHER PUBLICATIONS

U.S. Appl. No. 11/324,552, filed Jan. 4, 2006, Inokuchi et al.
Joachim Hagenauer, "Rate-Compatible Punctured Convolutional Codes (RCPC Codes) and their Aplications", IEEE Transactions on Communications, vol. 36, No. 4, Apr. 1988, pp. 389-400.

\* cited by examiner

*Primary Examiner*—Wayne Young
*Assistant Examiner*—Van T. Pham
(74) *Attorney, Agent, or Firm*—Oblon, Spivak, McClelland, Maier & Neustadt, P.C.

(57) ABSTRACT

A recording medium on which at least one piece of data that has been encoded with a first error correction code and data that can be decoded with the first error correction code and that can be decoded with a second error correction code that is different from the first error correction code.

42 Claims, 15 Drawing Sheets

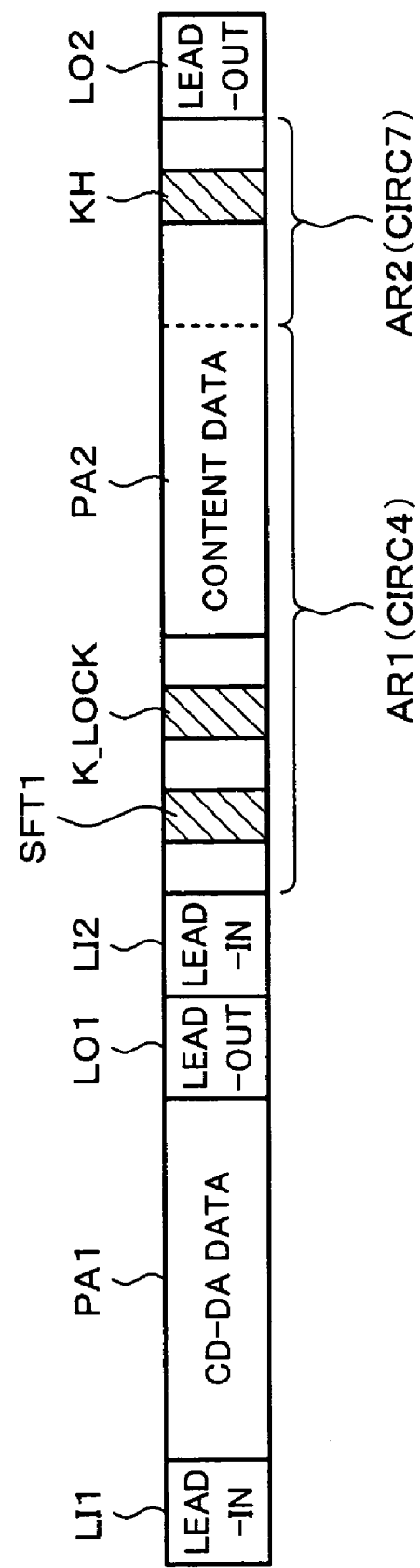

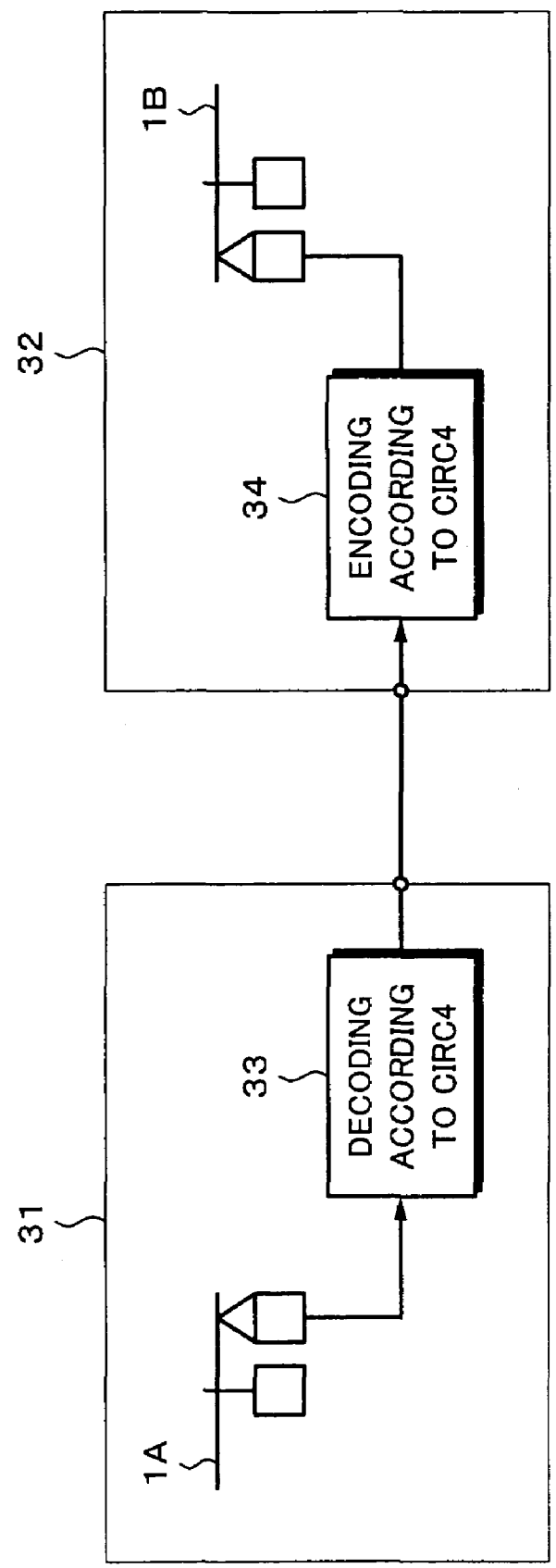

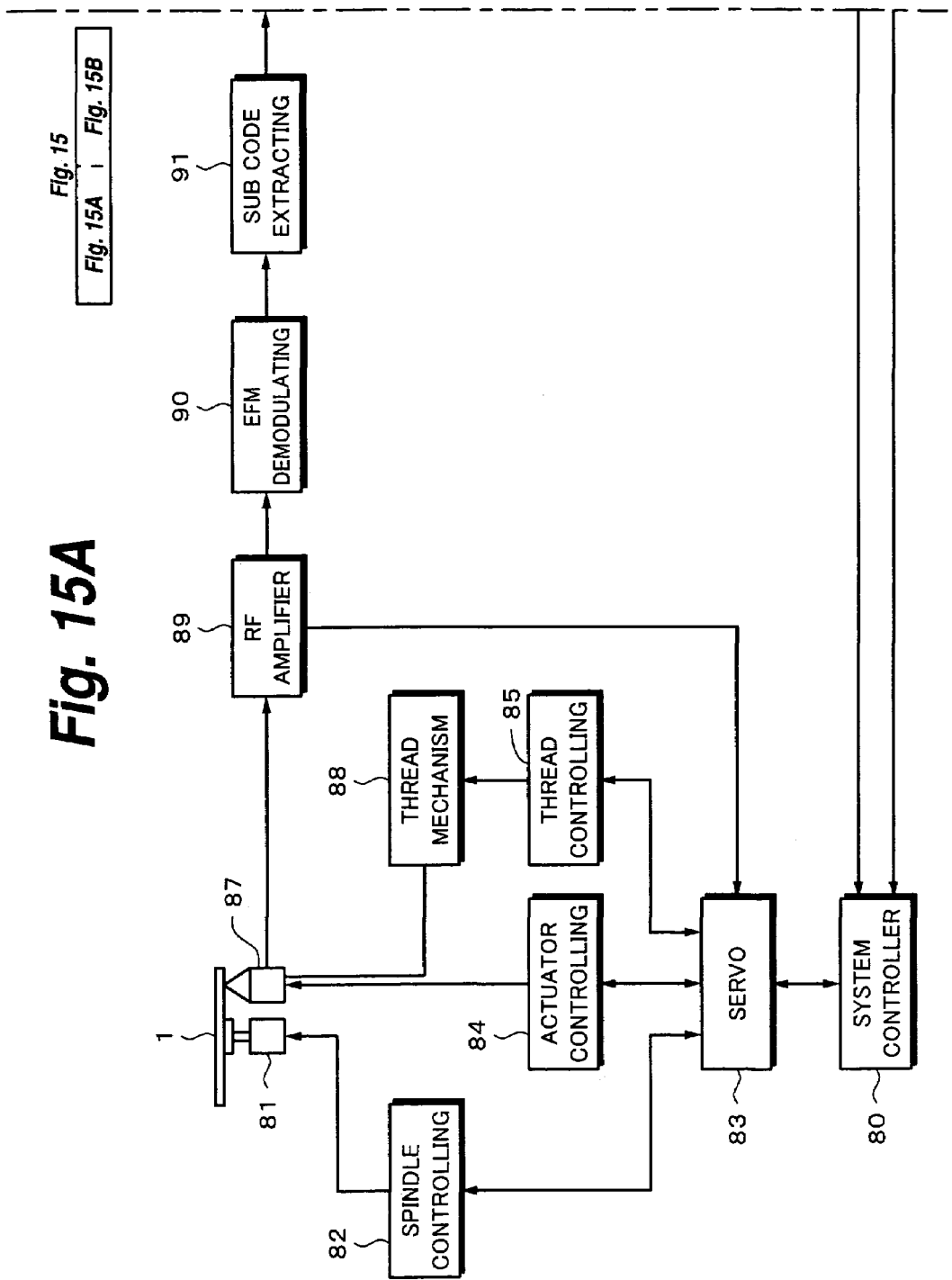

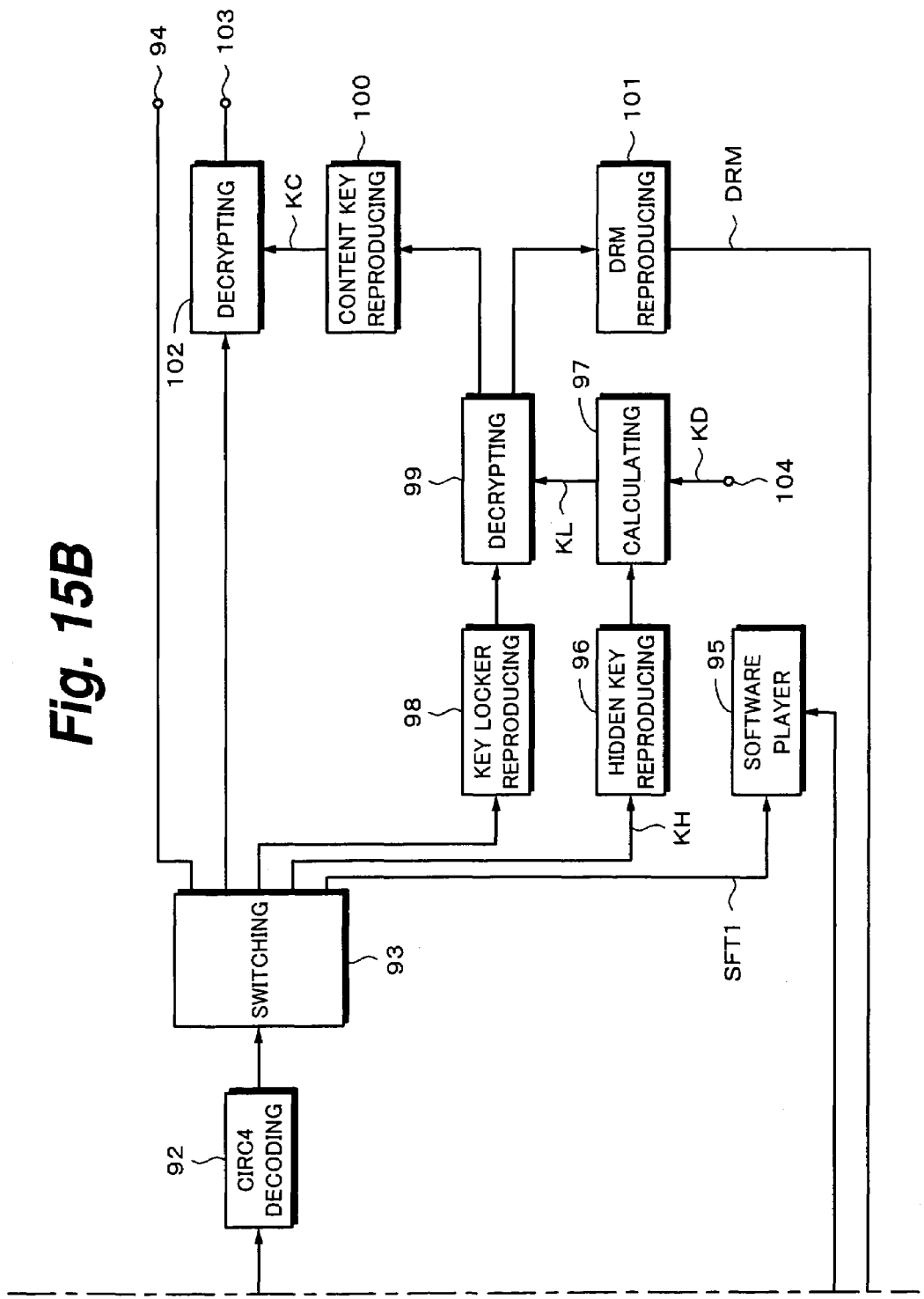

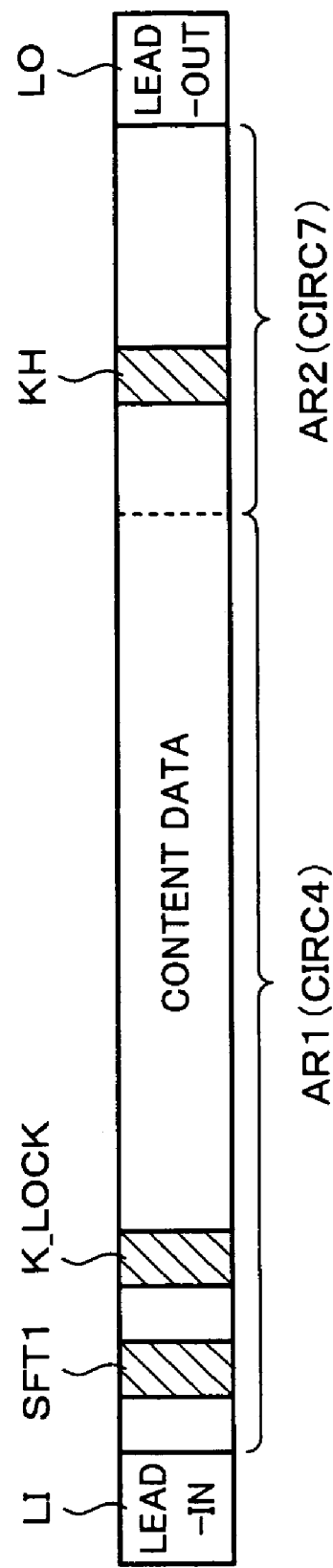

DATA RECORDING MEDIUM, DATA RECORDING METHOD AND APPARATUS, AND DATA REPRODUCING METHOD AND APPARATUS

TECHNICAL FIELD

The present invention relates to a data recording medium on which encrypted content data is recorded, a recording method and apparatus for recording data on such a data recording medium, and a data reproducing method and apparatus for reproducing data from such a data recording medium.

BACKGROUND ART

Since optical discs such as CDs (Compact Discs) and CD-ROMs (Compact Disc Read Only Memories) are easy to handle and their production costs are relatively low, as recording mediums for storing data, they have been widely used. In recent years, CD-R (Compact Disc Recordable) discs, which are data write-once type discs, and CD-RW (Compact Disc ReWritable) discs, which are data rewritable type discs, have come out. Thus, data can be easily recorded on such optical discs. Optical discs such as CD-DA (Compact Disc Digital Audio) discs, CD-ROM discs, CD-R discs, and CD-RW discs based on the CD standard have become the mainstream of data recording mediums. In recent years, moreover, content data such as audio data compressed according to MP3 (MPEG 1 Audio Layer-3) and ATRAC (Adaptive TRansform Acoustic Coding) 3 have been recorded on CD-R discs, CD-RW discs, and so forth.

However, since CD-R discs and CD-RW discs have come out, data recorded on optical discs such as CD-DA discs and CD-ROM discs can be easily copied. Thus, data recorded on discs has been copied to other discs and illegally used. As a result, a problem of copyright protection has arisen. Thus, it is necessary to take countermeasures for copyright protection of content data.

As one method for protecting content data recorded on such an optical disc, the content data recorded on the disc is encrypted.

When content data recorded on a disc has been encrypted, unless key data with which the content data is decrypted is obtained, the content data cannot be decrypted. Thus, the content data can be protected. A system that uses DRM (Digital Rights Management) data as information about copyright protection of content data to restrict reproducing operation and copy operation of the content data may be considered.

However, when content data is encrypted to protect copyright of content data, the recording position of key data thereof should be considered. To strongly protect content data, it is preferred to record the key data at a position that a conventional player and a conventional drive cannot easily access. As such a position that the conventional player the conventional drive cannot easily access, there would be for example a lead-in area, a lead-out area, or the like of a disc.

However, when key data with which content data is decrypted is recorded at a position such as a lead-in area, a lead-out area, or the like-that cannot be easily accessed, the content data cannot be reproduced unless a new type player or a new type drive that can deal with it is used. Players and drives that can record and reproduce data to/from CD-DA discs, CD-ROM discs, CD-R discs, and CD-RW discs have been widely used. Thus, in consideration of compatibility with the conventional players and drives, the key data cannot be recorded at a position that they cannot easily access. Thus, the key data has to be recorded at a position such as a program area of a disc that they can relatively easily access.

However, when the key data is recoded in the program area, there will be a risk of which content data cannot be sufficiently protected. In particular, some of conventional CD-R drives and CD-RW drives have a disc copy function. Those drives can copy all data of one disc to another disc. With such a function, there is a possibility of which key data recorded in the program area is copied as it is.

Therefore, an object of the present invention is to provide a data recording medium, a data recording method and apparatus, and a data reproducing method and apparatus that prevent a disc from being copied so as to protect copyright of contents.

DISCLOSURE OF THE INVENTION

The present invention is a recording medium on which at least one piece of data that has been encoded with a first error correction code and at least data that can be decoded with the first error correction code and that can be decoded with a second error correction code that is different from the first error correction code are recorded.

The present invention is a recording medium on which at least data that has been encoded with a first error correction code, data that has been encoded with a second error correction code, and data that can be decoded with the first error correction code and that can be decoded with the second error correction code are recorded.

The present invention is a recording method for a recording medium, comprising the steps of recording at least one piece of data that has been encoded with a first error correction code; and recording at least data that can be decoded with a second error correction code that is different from the first error correction code.

The present invention is a recording apparatus for a recording medium, comprising:

an encoding process portion for performing an encoding process including an error correction code encoding process for input data with a first error correction code; a recording portion for receiving output data of the encoding process portion and recording the received data on the recording medium; and a generating portion for generating data that can be decoded with the first error correction code and that can be decoded with a second error correction code that is different from the first error correction code.

The present invention is a reproducing apparatus for a recording medium, comprising a head portion for reading data from the recording medium on which at least one piece of data that has been encoded with a first error correction code and data that can be decoded with the first error correction code and a second error correction code that is different from the second error correction code have been recorded; a decoding process portion for performing a decoding process including an error correction code decoding process for an output signal of the head portion with the first error correction code; and a controlling portion for performing a control with the output data of the decoding process portion corresponding to the data that can be decoded.

The present invention is a reproducing method for a recording medium, comprising the steps of reading data from the recording medium on which at least one piece of data that has been encoded with a first error correction code and data that can be decoded with the first error correction code and a second error correction code that is different from the second error correction code have been recorded and performing a decoding process including an error correction code decoding process for the read data with the first error correction code; and performing a control with the output data of which the decoding process has been performed corresponding to the data that can be decoded.

BRIEF DESCRIPTION OF DRAWINGS

FIG. 2 is a schematic diagram for describing the optical disc according to the present invention;

FIG. 3 is a block diagram for describing the optical disc according to the present invention;

FIG. 15A and FIG. 15B are block diagrams showing an example of a reproducing apparatus for the optical disc according to the present invention; and FIG. 16 is a schematic diagram showing another example of the optical disc according to the present invention.

BEST MODES FOR CARRYING OUT THE INVENTION

Next, with reference to the accompanying drawings, an embodiment of the present invention will be described. According to the embodiment, as a recording medium, a new type optical disc is used. An optical disc according to the present invention is almost the same as a CD disc in physical standards such as size. Information recorded on the optical disc according to the present invention can be optically read by a conventional disc drive.

Encrypted content data is recorded on the optical disc according to the present invention. The encrypted content data is for example CD-ROM format and CD-DA format audio data and picture data that have been encrypted. As an example of the encrypting method, DES (Data Encryption Standard) can be used. When necessary, content data is compression-encoded according to ATRAC3 (Adaptive TRansform Acoustic Coding 3), MP 3 (MPEG Audio Layer-3), AAC (MPEG 2 Advanced Audio Coding), TwinVQ, or the like.

Figure 1:
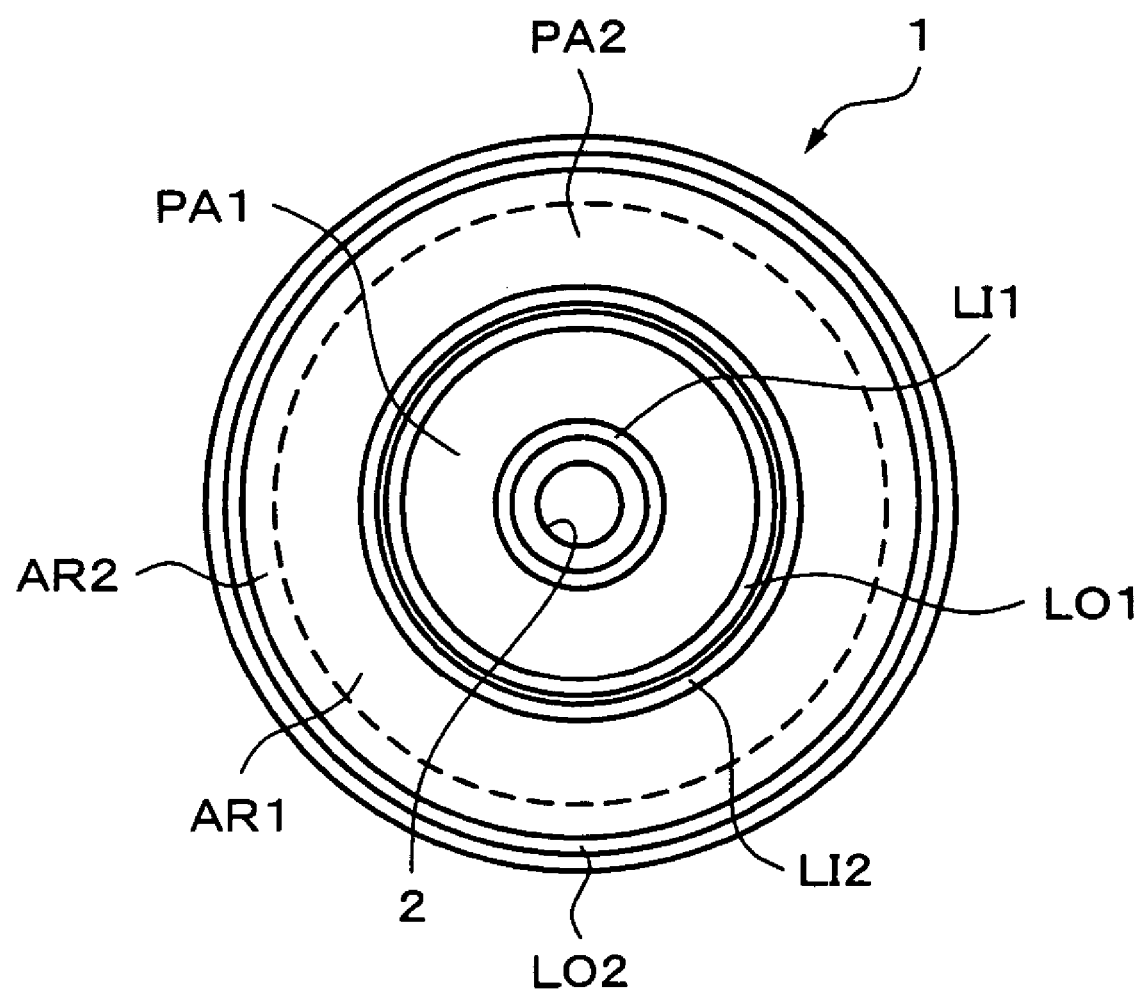
FIG. 1 is a plan view for describing an optical disc according to the present invention.

FIG. 1 and FIG. 2 show the structure of the optical disc according to the present invention. The diameter of the optical disc 1 according to the present invention is 120 mm. A hole 2 is formed at the center of the optical disc 1. There is another optical disc 1 having a diameter of 80 mm, which is referred to as CD single.

In addition, there are three types of optical discs 1 categorized as a reproduction only type optical disc, a write once type optical disc, and a re-recordable type optical disc.

In the reproduction only type optical disc 1, a recording layer is made of aluminum. In the reproduction only type optical disc 1, data is recorded as physical pits. Normally, such a disc is produced by a stamper. A recording layer as a reflecting layer made of aluminum is coated on the substrate.

In the write once type optical disc 1, a recording layer is made of an organic coloring matter such as phthalocyanine or cyanine. In the write once type optical disc, when data is written, the temperature of the recording layer made of an organic coloring matter on the disc is raised by a laser beam. As a result, the recording layer made of the coloring matter is thermally deformed.

In the re-recordable type optical disc 1, a recording layer is made of a phase change material. The phase change material is for example an alloy of Ag—In—Sb—Te (silver-indium-antimony-tellurium) is used. Such a phase change material has a crystal phase and an amorphous phase. When the intensity of the laser beam is strong, namely the power of the laser beam is strong, the temperature of the recording layer made of the phase change material is raised over the melting point and then the material is quickly cooled. As a result, the phase change recording layer becomes an amorphous state. When the intensity of the laser beam is relatively low, namely the power of the laser beam is weak, the recording layer made of the phase change material is raised to around the crystallization temperature and then gradually cooled. As a result, the recording layer becomes a crystal state. When the recording layer is irreversibly changed between the crystal phase and the amorphous phase, data can be rewritten.

As shown in FIG. 2, a first lead-in area LI1 is formed on the innermost periphery of the optical disc. On an outer periphery of the lead-in area LI1, a first program area PA1 is formed. On an outer periphery of the first program area Pa1, a first lead-out area LO1 is formed. In the first program area PA1, audio data is recorded in the same recording format as data in the CD-DA format. The audio data in the first program area PA1 has the same recording format as data in the CD-DA format. In addition, since the audio data has not been encrypted, it can be reproduced by a conventional music reproducing player, namely a CD player that has a reproducing function for a CD-DA disc.

Outside the first lead-out area LO1, a second lead-in area LI2 is formed. On an outer periphery of the lead-in area LI2, a second program area PA2 is formed. Outside the second program area PA2, a second lead-out area is formed. In the second program area PA2, audio data that has been compressed according to for example ATRAC3 encoding system is encrypted and recorded as content data.

In addition, the second program area PA2 is divided into an area AR1 and an area AR2. In the area AR1, data has been encoded with an error correction code according to the CIRC4 system. In the area AR2, data has been encoded with an error correction code according to the CIRC7 system.

In the area AR1, audio data that has been compressed according to for example the ATRAC3 system is encrypted and recorded as content data. In addition, in the area AR1, key locker data K_LOCK and data of a software player SFT1 are recorded.

Key locker data is a plurality of pieces of content key data that have been encoded and encrypted. A plurality of pieces of content key data can be taken for a locker that stores a plurality of pieces of content key data in the real world. Thus, it is called so. In other words, in the real world, keys of individual rooms are stored in one locker. The locker is locked with a key. An operation for encoding and encrypting content keys with which a plurality of contents recorded on an optical disc are decrypted is analogous to an operation for storing keys of individual rooms in a locker in the real world. Thus, the operation for encoding and encrypting a plurality of pieces of content key data is called key locker data. In addition, the key locker data may contain copyright management information with which copyright of content data is managed (for example, restrictions of reproducing operation and copy operation for content data).

Data of the software player SFT1 is program data for causing software to decrypt content data.

Somewhere in the area AR2, at least part of key data with which content data recorded in the area AR1 of the second program area PA2 is recoded as hidden key data KH. The hidden key data KH is recorded in such a manner that it can be decoded according to any one of the CIRC4 system and the CIRC7 system.

In other words, as will be described later, the CIRC4 system and the CIRC7 system perform an error correction code encoding process based on the CIRC (Cross Interleave Reed-Solomon Code) system used in a conventional CD. The CIRC4 system is different from the CIRC7 system in the interleave length. In this example, an error correction code encoding system used in conventional CD-R disc, CD-R disc, and CD-RW disc drives is referred to as CIRC4 system. In contrast, an error correction code encoding system that will be used in double-density CDs is referred to as CIRC7 system.

An error correction code decoding apparatus according to the CIRC4 system cannot decode data that has been encoded with an error correction code according to the CIRC7 system. Thus, data in the area AR2 that has been encoded with the error correction code according to the CIRC7 system cannot be decrypted by a conventional player and a conventional drive.

However, data in a special matrix can be decoded according to any one of the CIRC4 system and the CIRC7 system. As will be described later, as the special relation, predetermined data is repeated as one unit in the vertical direction when data is two-dimensionally arrayed. The above-mentioned hidden key data KH is data of which predetermined data is repeated as one unit in the vertical direction. The hidden key data KH is encoded with the error correction code according to the CIRC7 system and recorded in the area AR2.

In the optical disc 1 shown in FIG. 1 and FIG. 2, when the conventional player and drive that have only an error correction code decoding circuit according to the CIRC4 system decodes content data recorded in the second program area PA2, the application of the software player SFT1 gets started.

The data of the software player SFT1 contains the recording position of the hidden key data KH in the area AR2. With the hidden key data KH, data of the key locker data K_LOCK is decrypted. When the application of the software player SFT1 gets started, the recording position of the hidden key data KH is designated.

The hidden key data KH is recorded in the area AR2 in such a manner that the hidden key data KH can be decoded according to any one of the CIRC4 system and the CIRC7 system. Thus, when the recording position of the hidden key data KH is obtained, the conventional player and driver, which have only the error correction code decoding circuit, can take the hidden key data KH out of the area AR2.

When the software player SFT1 designates the recording position of the hidden key data KH in the area AR2, the software player SFT1 accesses the position and reads the hidden key data KH from the area AR2.

With the hidden key data KH, key locker data key KL is generated. With the key locker data key KL, key locker data is decrypted. With the key locker data key KL, data of the locker K_LOCK is obtained. Content key data KC with which content data is decrypted is taken out of the key locker data K_LOCK. With the content key data KC, the content data is decrypted.

In the forgoing example, the content key KC with which content data is decrypted is stored in the key locker data K_LOCK. Part of a key with which the key locker data key KL is generated is recorded as the hidden key data KH in the area AR2. In other words, since content data is multiply locked, the security thereof is improved and the management thereof becomes simple.

Of course, the content key data KC may be recorded in the area AR2 in which content data is encoded with the error correction code according to th CIRC7 system in such a manner that the content key data KC can be decoded according to any one of the CIRC4 system and the CIRC7 system. The key locker data key KL may be recorded in the area AR2 in which content data is encoded with the error correction code according to the CIRC7 system in such a manner that the key locker data key KL can be decoded according to any one of the CIRC4 system and the CIRC7 system.

Although there are many encrypting systems, at least part of key data with which content data is decrypted is recorded in the area AR2 in which content data is encoded with the error correction code according tot the CIRC7 system in such a manner that the key data is decoded according to any one of the CIRC4 system and the CIRC7 system. Data that represents the recording position is provided.

In the optical disc 1 according to the present invention, the second program area PA2 is divided into two areas AR1 and AR2 in which content data is encoded according to different error correction code encoding systems. In the area AR2, at least part of key data with which content data is decrypted is recorded in such a manner that the content data can be decoded according to any one of the CIRC7 system and the CIRC4 system.

In the optical disc 1, even if it is known that the hidden key data KH, which is at least part of the key data with which content data is decrypted, is recorded in the area AR2, the hidden key data KH is recorded in the area AR2 in which content data is encoded with the error correction code according to the CIRC7 system. Thus, when the conventional player and drive read data from the area AR2, an error that cannot be corrected takes place. Thus, the hidden key data KH cannot be easily found out.

In the area AR2, content data has been encoded with the error correction code according to the CIRC7 system. Thus, even if whole data recorded on the disc is copied, data in the area AR2 is not copied as it is. Thus, the hidden key data KH is protected. As a result, security against whole disc copy (hereinafter simply referred to as disc copy) is improved.

FIG. 3 shows an outline of a process for disc-copying data from an original optical disc 1A to a destination optical disc 1B. In FIG. 3, as was described above, in the area AR2 of the original optical disc 1A, data that has been encoded with the error correction code according to the CIRC7 system is recorded. The data contains the hidden key data KH in such a manner that the hidden key data KH can be decoded according to any one of the CIRC4 system and the CIRC7 system.

In a reproducing apparatus 31, the original optical disc 1A is loaded. Data is read from the original optical disc 1A. The data that has been read from the original optical disc 1A is supplied to an error correcting circuit 33. The error correcting circuit 33 performs an error correcting process for the data that has been read from the original optical disc 1A according to the CIRC4 system.

Figure 4A:
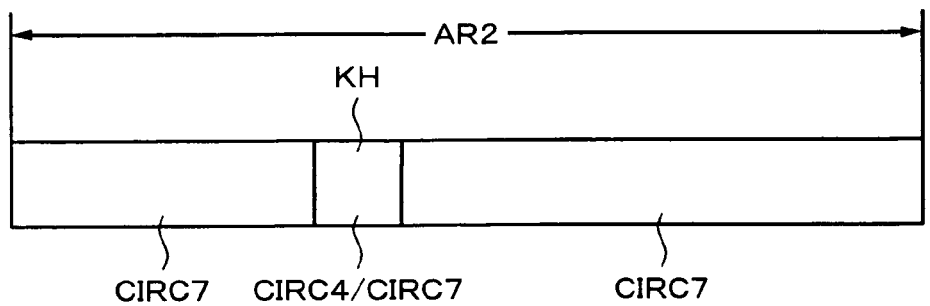
FIG. 4A, FIG. 4B, and FIG. 4C are schematic diagrams for describing the optical disc according to the present invention.

As shown in FIG. 4A, in the area AR2 of the original optical disc 1A, data that has been encoded with the error correction code according to the CIRC7 system is recoded. The data contains the hidden key data KH in such a manner that the hidden key data KH can be decoded according to any one of the CIRC4 system and the CIRC7 system. In that case, most of data in the area AR2 except for a portion that can be decoded according to any one of the CIRC4 system and the CIRC7 system results in an error that cannot be corrected. When most of data results in an error that cannot be corrected, some apparatuses stop due to a presence of abnormality. When an apparatus stops due to a presence of abnormality, the apparatus cannot disc-copy data.

Figure 4B:
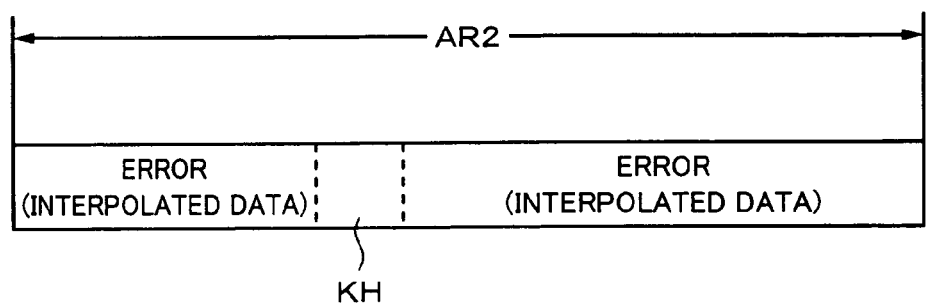

When data is reproduced, if an error that cannot be corrected takes place, interpolated data is substituted for the error. Now, assuming that interpolated data is substituted for an error that cannot be corrected, when data is output from the reproducing apparatus 31, as shown in FIG. 4B, interpolated data is substituted for data in the area AR2. As a result, the hidden key data KH disappears.

Now, it is assumed that the reproducing apparatus 31 performs such an interpolating process and output data of the reproducing apparatus 31 is sent to a recording apparatus 32. The destination optical disc 1B is loaded to the recording apparatus 32. The data that has been input to the recording apparatus 32 is supplied to an error correction code encoding circuit 34 according to the CIRC4 system. The error correction code encoding circuit 34 performs an error correction code encoding process for the input data according to the CIRC4 system. The data that has been encoded with the error correction code according to the CIRC4 system is recorded on the optical disc 1B.

Figure 4C:
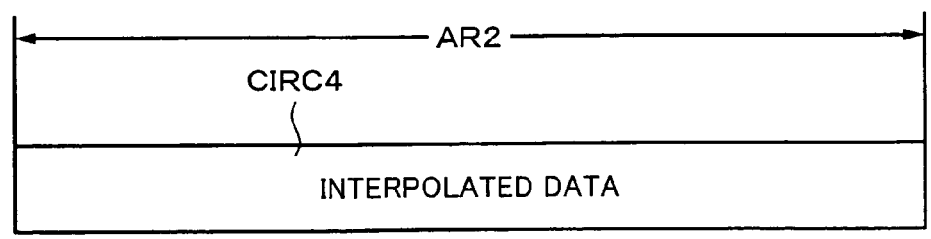

Thus, on the copied optical disc 1B, data that has been encoded with the error correction code according to the CIRC4 system is recorded. Thus, as shown in FIG. 4C, the hidden key data KH in the area AR2 completely disappears.

An error correction code is normally added so as to detect a burst error and random error and perform a correcting process. However, in the optical disc 1 according to the present invention, at least part of key data with which content data is decoded according to any one of the CIRC7 system and the CIRC4 system is recorded in the area AR2 in which data is encoded with the error correction code according to the CIRC7 system so as to improve the security.

Next, the error correction code according to the CRIC4 system and the error correction code according to the CIRC7 system will be described.

In CDs, as an error correction code encoding system, a CIRC of which an error correction code encoding process is dually performed for a C1 sequence (in the vertical direction) and a C2 sequence (in the diagonal direction) is used. Data that has been encoded with the error correction code is EFM-modulated in the unit of one frame and recorded.

Figure 5:
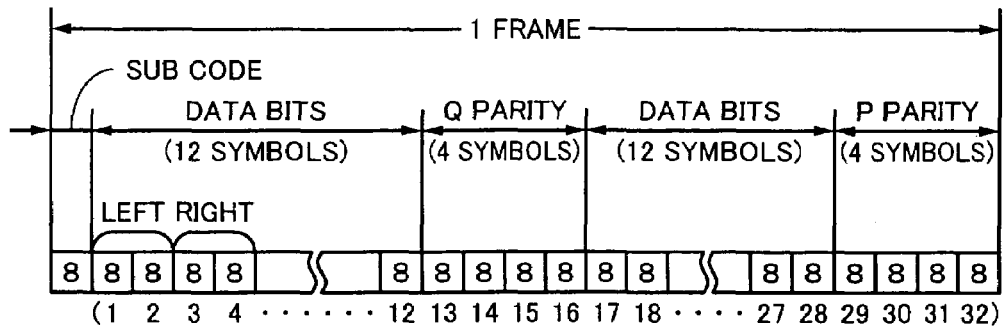
FIG. 5 is a schematic diagram for describing a recording format of the optical disc according to the present invention.

FIG. 5 shows one frame of a CD data structure that has not been EFM modulated.

As shown in FIG. 5, when audio data is sampled with 16 bits, one frame is composed of 24 symbols of data bits, four symbols of a Q parity, four symbols of a P parity, and one symbol of a sub code. 24 symbols of data bits are composed of six samples on the left (L) and six samples on the right (R). One symbol is made of eight bits of which 16 bits are divided by two. Data of one frame recorded on the disc is converted from eight bits into 14 bits by the EFM modulation. In addition, a direct current component suppression bit and a frame sync are added to data of one frame.

Thus, one frame recorded on the disc is composed of:

| | |
|---|---|
| Frame sync | 24 channel bits |
| Data bits | 14 × 24 = 336 channel bits |
| Sub code | 14 channel bits |
| Parity | 14 × 8 = 112 channel bits |
| Margin bits | 3 × 34 = 102 channel bits |

Thus, the total number of channel bits of one frame is 588 channel bits.

Figure 6:
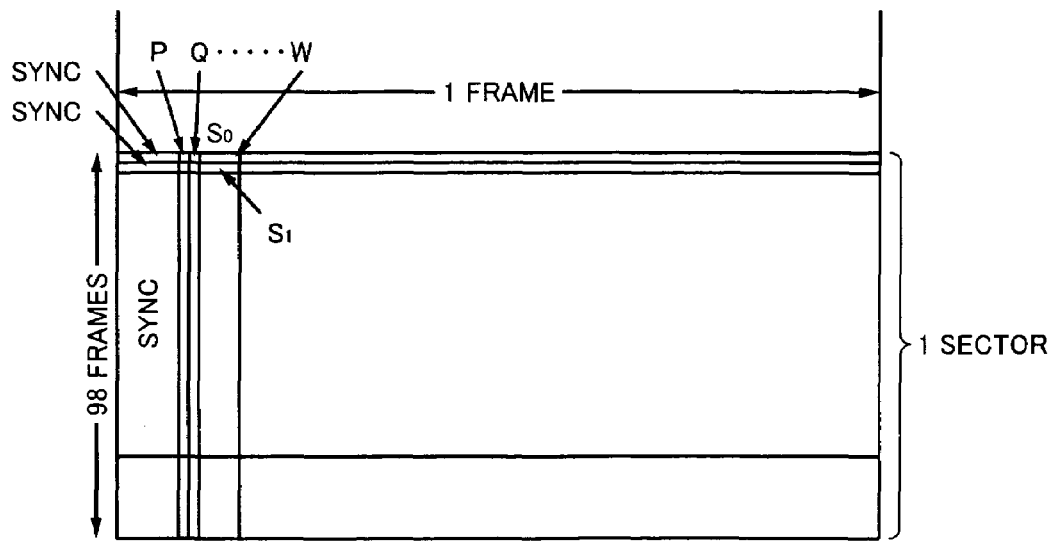
FIG. 6 is a schematic diagram for describing the recording format of the optical disc according to the present invention.

One symbol of a sub code of each frame contains bits of eight channels P to W. As shown in FIG. 6, one sector is composed of data in the period (98 frames) for sub code. The first two frames of 98 frames are sub code frame syncs S0 and S1. When data is recorded on an optical disc such as a CD-ROM, one sector is composed of 98 frames (2,352 bytes), which is a sub code completion unit.

Figure 7:
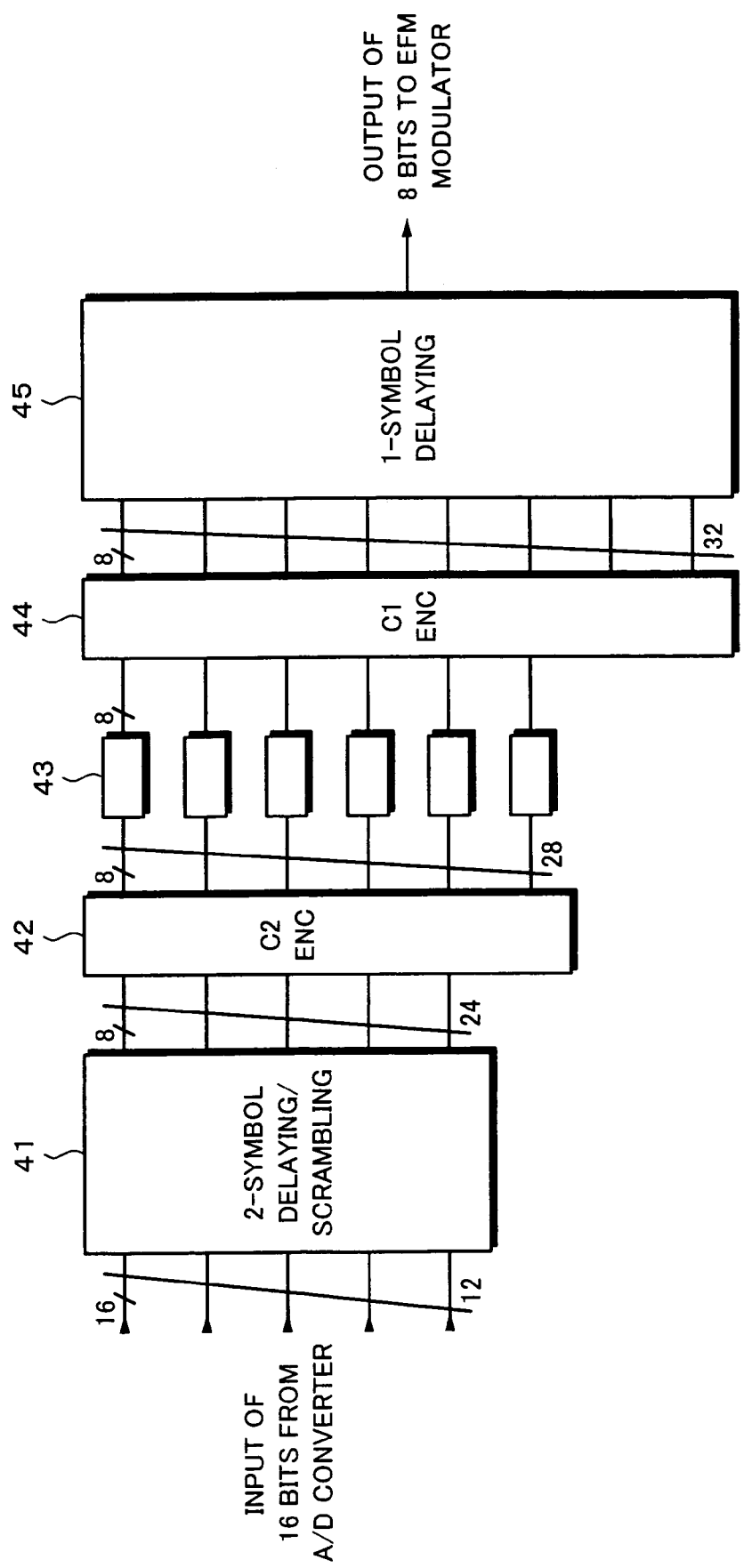
FIG. 7 is a schematic diagram for describing the recording format of the optical disc according to the present invention.
Figure 8:
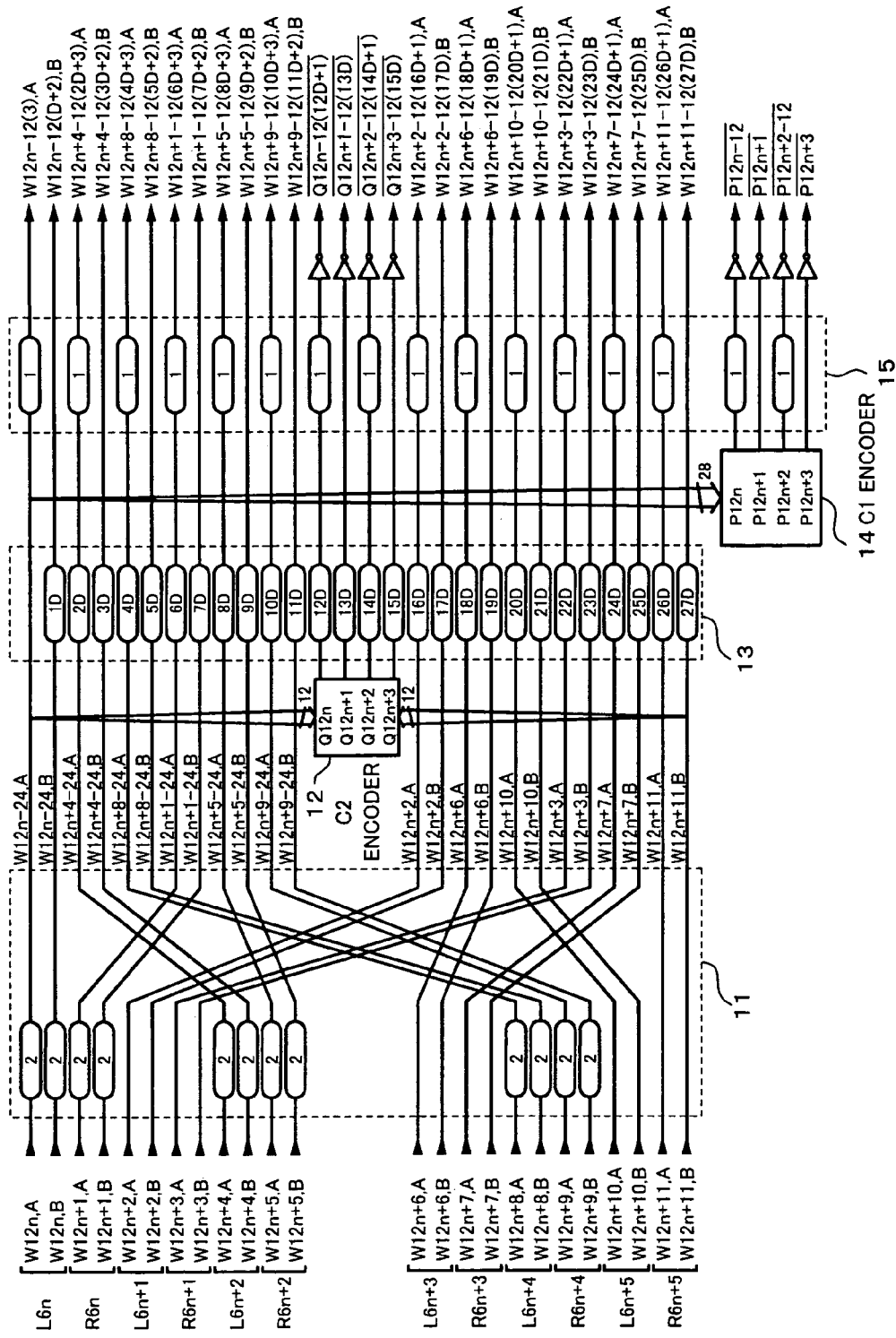
FIG. 8 is a schematic diagram for describing the recording format of the optical disc according to the present invention.

FIG. 7 and FIG. 8 are block diagrams showing a flow of an encoding process according to the CIRC system. For simplicity, the encoding process/decoding process according to the CIRC system will be described for audio data.

24 symbols (W12$n$, A, W12$n$, B, . . . , W12$n$+11, A, W12$n$+11, B) of which one word of an audio signal is divided into high order eight bits and low order eight bits) (high order eight bits are denoted by A and lower eight bits by B) are supplied to a two-symbol delaying/scrambling circuit 11. The two-symbol delaying/scrambling circuit 11 delays each of the even word data L6$n$, R6$n$, L6$n$+2, R6n+2, . . . by two symbols. Even if all the corresponding sequence has an error in a C2 encoder 12, the two-symbol delaying/scrambling circuit 11 interpolates it. The two-symbol delaying/scrambling circuit 11 scrambles the 24 symbols so that the maximum burst error interpolation length can be obtained.

Outputs of the two-symbol delaying/scrambling circuit 11 are supplied to the C2 encoder 12. The C2 encoder 12 encodes (28, 24, 5) Reed-Solomon code on the Galois field GF (28) and generates four-symbol Q parities Q12$n$, Q12+1, Q12$n$+2, and Q12$n$+3.

28 symbols that are output from the C2 encoder 12 are supplied to an interleaving circuit 13. The interleaving circuit 13 assigns delay amounts that vary in arithmetic progression such as 0, D, 2D, (where D represents a unit delay amount) to each symbol so as to change one array of a symbol to a second array.

Outputs of the interleaving circuit 13 are supplied to a C1 encoder 14 that uses (32, 28, 5) Reed-Solomon code on the Galois field (GF 28) as a C1 code.

The C1 encoder 14 generates four-symbol P parities P12n, P12n+1, P12n+2, and P12n+3. The minimum distance of each of the C1 code and C2 code is 5. Thus, the C1 encoder 14 can correct a two-symbol error and erasure-correct a four-symbol error (in the case that the position of an error symbol is known).

32 symbols that are output from the C1 encoder 14 are supplied to a one-symbol delaying circuit 15. The one-symbol delaying circuit 15 separates adjacent symbols so as to prevent an error that spreads over a boundary of one symbol from resulting in a two-symbol error. The Q parity is inverted by an inverter. Thus, even if all data and parities become zero, an error can be detected.

The unit delay amount D of the interleaving circuit 13 according to the CIRC4 system is different from that according to the CIRC7 system. The interleaving circuit 13 disperses a burst error.

In other words, according to the CIRC4 system, the interleaving circuit 13 designates D=4 frames and separates adjacent symbols by four frames each. The CIRC4 system of D=4 frames is used in the current CD-DA. According to the CIRC4 system, the maximum delay amount becomes 27D (=108 frames). The total interleave length becomes 109 frames.

According to the CIRC7 system, the interleaving circuit 13 designates D=7 frames and separates adjacent symbols by seven frames each. The CIRC7 system of D=7 frames has been proposed for a double density CD. According to the CIRC7 system, the maximum delay amount becomes 27D (=189 frames). The total interleave length becomes 190 frames.

Figure 9:
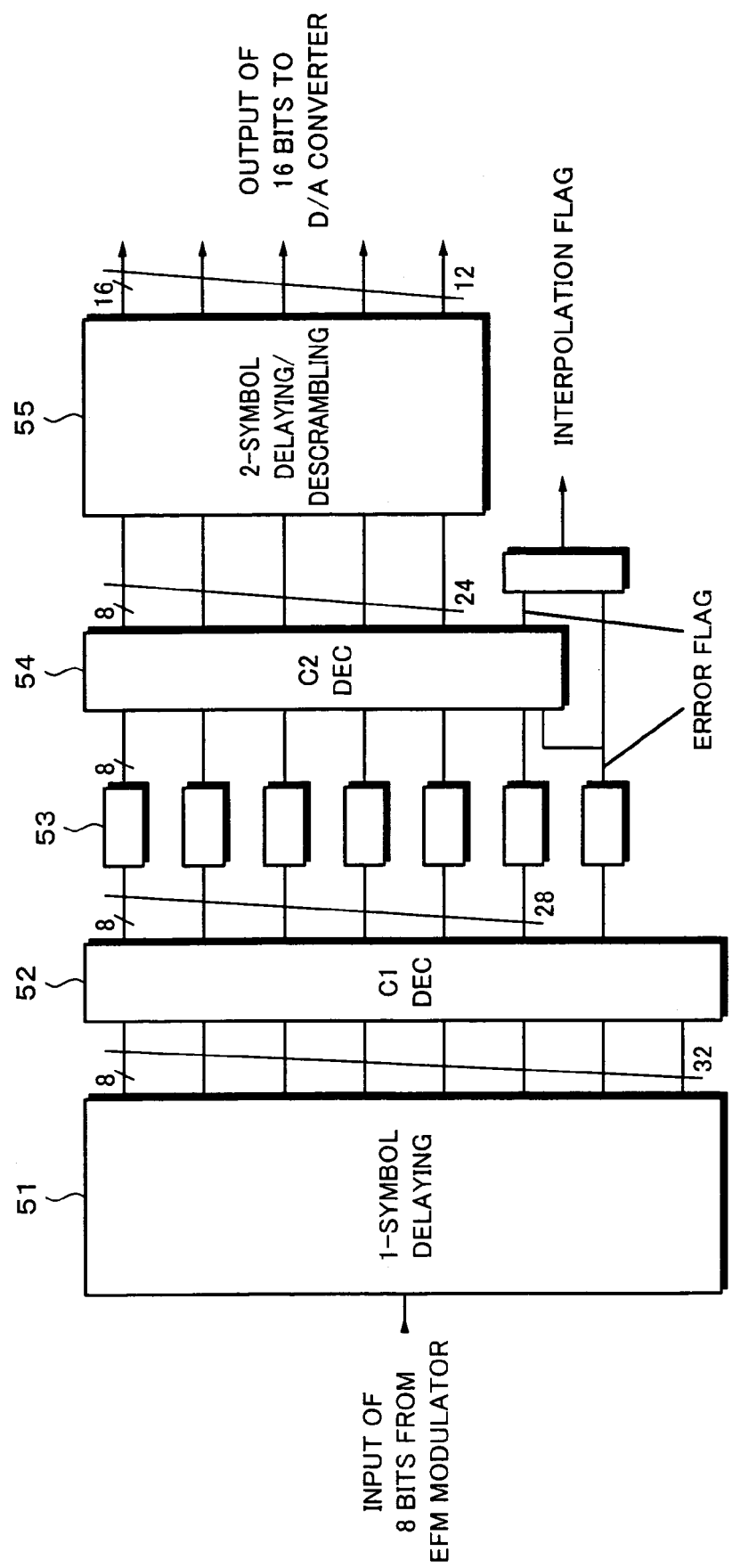
FIG. 9 is a schematic diagram for describing the recording format of the optical disc according to the present invention.
Figure 10:
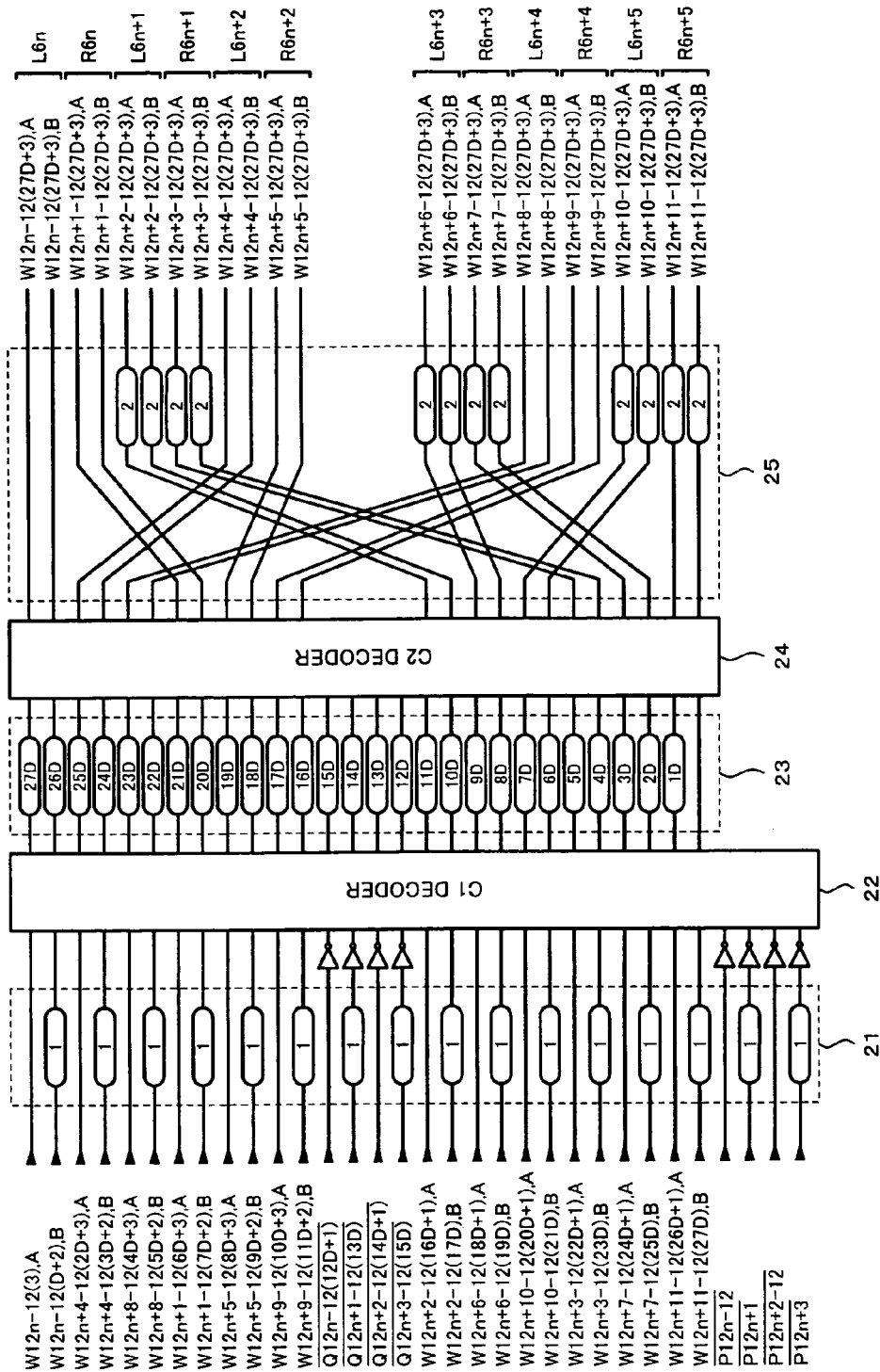
FIG. 10 is a schematic diagram for describing the recording format of the optical disc according to the present invention.

FIG. 9 and FIG. 10 are block diagrams showing a flow of the decoding process. The decoding process is performed in the reverse order of the forgoing encoding process.

Reproduction data that is output from the EFM demodulating circuit is supplied to a one-symbol delaying circuit 21. The delay assigned by the one-symbol delaying circuit 15 on the encoding side is cancelled by the one-symbol delaying circuit 21.

32 symbols that are output from the one-symbol delaying circuit 21 are supplied to a C1 decoder 22. Outputs of the C1 decoder 22 are supplied to a de-interleaving circuit 23. The de-interleaving circuit 23 assigns delay amounts 27D, 26D, . . . , D, and 0 that vary in arithmetic progression to the 28 symbols so that the delay amounts assigned by the interleaving circuit 13 are cancelled.

According to the CIRC4 system, the unit delay amount of the de-interleaving circuit 23 is D=4 frames. According to the CIRC7 system, the unit delay amount of the de-interleaving circuit 23 is D=7 frames.

Outputs of the de-interleaving circuit 23 are supplied to a C2 decoder 24. The C2 decoder 24 decodes the outputs of the de-interleaving circuit 23 with the C2 code. 24 symbols that are output from the C2 decoder 24 are supplied to a two-symbol delaying/descrambling circuit 25. 24 symbols of decoded data are obtained from the two-symbol delaying/descrambling circuit 25.

With error flags that are output from the C1 decoder 22 and the C2 decoder 24, an interpolation flag generating circuit 26 generates an interpolation flag. With the interpolation flag, data that represents an error is interpolated.

In such a manner, according to the CIRC, the error correction code encoding process is performed with the C1 sequence in the vertical direction. In addition, the error correction code encoding process is performed with the C2 sequence in the diagonal direction. Thus, the error correction code encoding process is dually performed. The CIRC4 system and the CIRC7 system differ in their interleave lengths.

Figure 11:
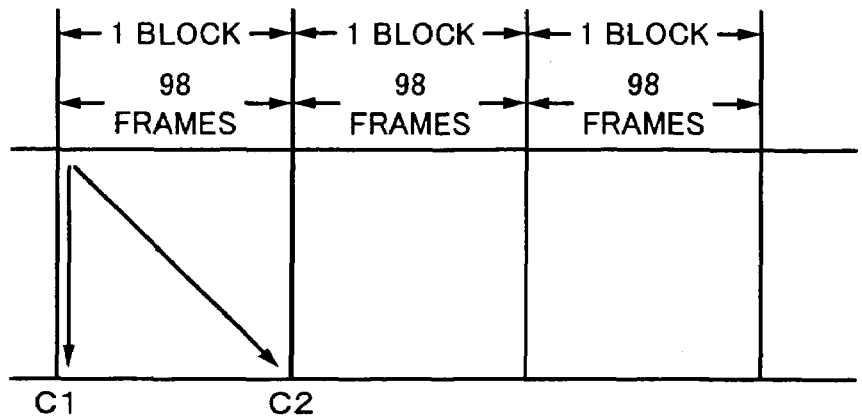
FIG. 11 is a schematic diagram for describing interleaving in CIRC4 system.

According to the CIRC4 system, as shown in FIG. 11, the unit delay amount D is (D=4). The total interleave length is 109 (=108+1) frames. Thus, according to the CIRC4 system, the total interleave length is slightly larger than the data length of one block. According to the CIRC7 system, as shown in FIG. 11, the unit delay amount D is (D=7). The total interleave length is 190 (=189+1) frames. Thus, according to the CIRC7 system, the total interleave length is slightly shorter than the data length of two blocks.

The total interleave length defines the correction performance against a burst error of which much data successively fails due to a fingerprint left on the disc, a scratch thereon, and so forth. The total interleave length is proportional to the correction performance for a burst error. In the double density CD, an improvement of correction performance against a burst error has been desired. Thus, in the double density CD, an error correction code according to the CIRC7 system has been proposed so as to improve correction performance against a bust error.

As described above, in the optical disc 1 according to the present invention, in the area AR2, data is encoded with the error correction code according to the CIRC7 system and recorded. Moreover, in the area AR2, a pattern of data that can be decoded according to any one of the CIRC7 system and the CIRC4 system is contained. Next, data that can be decoded according to any one of the CIRC7 system and the CIRC4 system will be described.

As was described above, since the CIRC4 system and the CIRC7 system differ in their interleave lengths, data that has been encoded with the error correction code according to the CIRC7 system can be decoded by a decoder according to the CIRC4 system. In contrast, data that has been encoded with the error correction code according to the CIRC4 system cannot b decoded by the decoder according to the CIRC7 system.

However, when data is a particular array, it can be decode by any one of a decoder according to the CIRC4 system and a decoder according to the CIRC7 system.

Figure 13:
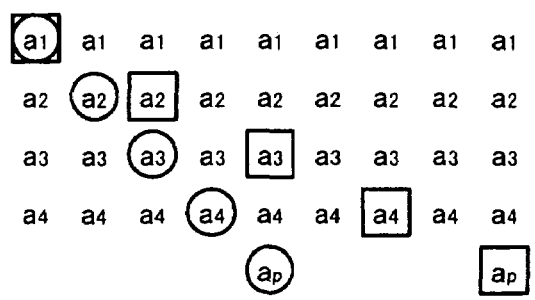
FIG. 13 is a schematic diagram for describing data that can be decoded according to any one of CIRC4 system and CIRC7 system.

FIG. 13 describes a data array that can be decoded by any one of a decoder according to the CIRC4 system and a decoder according to the CIRC7 system. In the data array shown in FIG. 13, when data is two-dimensionally arrayed, predetermined data is repeated as one unit in the vertical direction, namely in the unit of a C1 sequence. In the example, data is repeated as one unit of a1, a2, a3, and a4 in the vertical direction.

In such a data array, the same data is arranged in the horizontal direction. In other words, as shown in FIG. 13, data of the first row in the horizontal direction is all a1. Data of the second row in the horizontal direction is all a2. Data of the third row in the horizontal direction is all a3. Data of the fourth row in the horizontal direction is a4. In such a manner, the same data is arranged in the horizontal direction.

Figure 12:
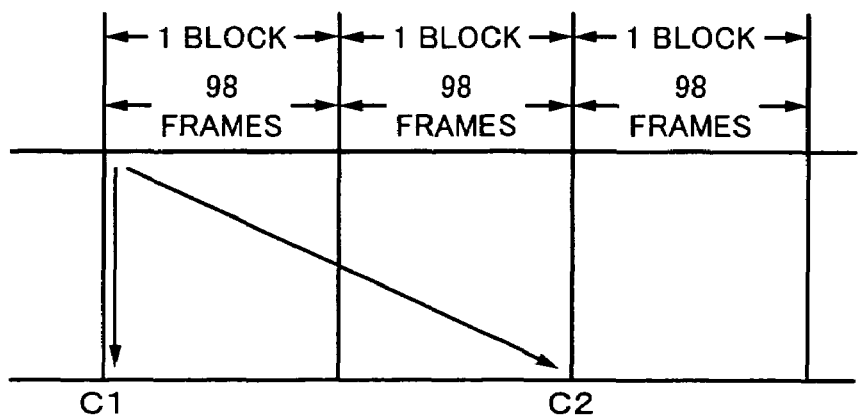
FIG. 12 is a schematic diagram for describing interleaving in CIRC7 system.

When data is arrayed in such a manner, like the C1 sequence, the C2 sequence according to the CIRC4 system is the same as the C2 sequence according to the CIRC7 system. In other words, in the example shown in FIG. 12, regardless of the total interleave length (namely, the angle of the diagonal direction), the parity of the C2 sequence is always composed of a1, a2, a3, and a4.

Thus, when data is arrayed in such a manner, data that has been encoded with the error correction code according to the CIRC7 system can be decoded by a decoder according to the CIRC4 system. Reversely, data that has been encoded with the error correction code according to the CIRC4 system can be decoded by a decoder according to the CIRC7 system.

Thus, since the interleave length according to the CIRC4 system is different from the interleave length according to the CIRC7 system, data that has been encoded with the error correction code according to the CIRC7 system cannot be decoded by a decoder according to the CIRC4 system. In addition, data that has been encoded with the error correction code according to the CIRC4 system cannot be decoded by a decoder according to the CIRC7 system. As was described above, however, when predetermined data is repeated in the vertical direction, the data can be decoded by any one of a decoder according to the CIRC7 system and a decoder according to the CIRC4 system.

Figure 14A:
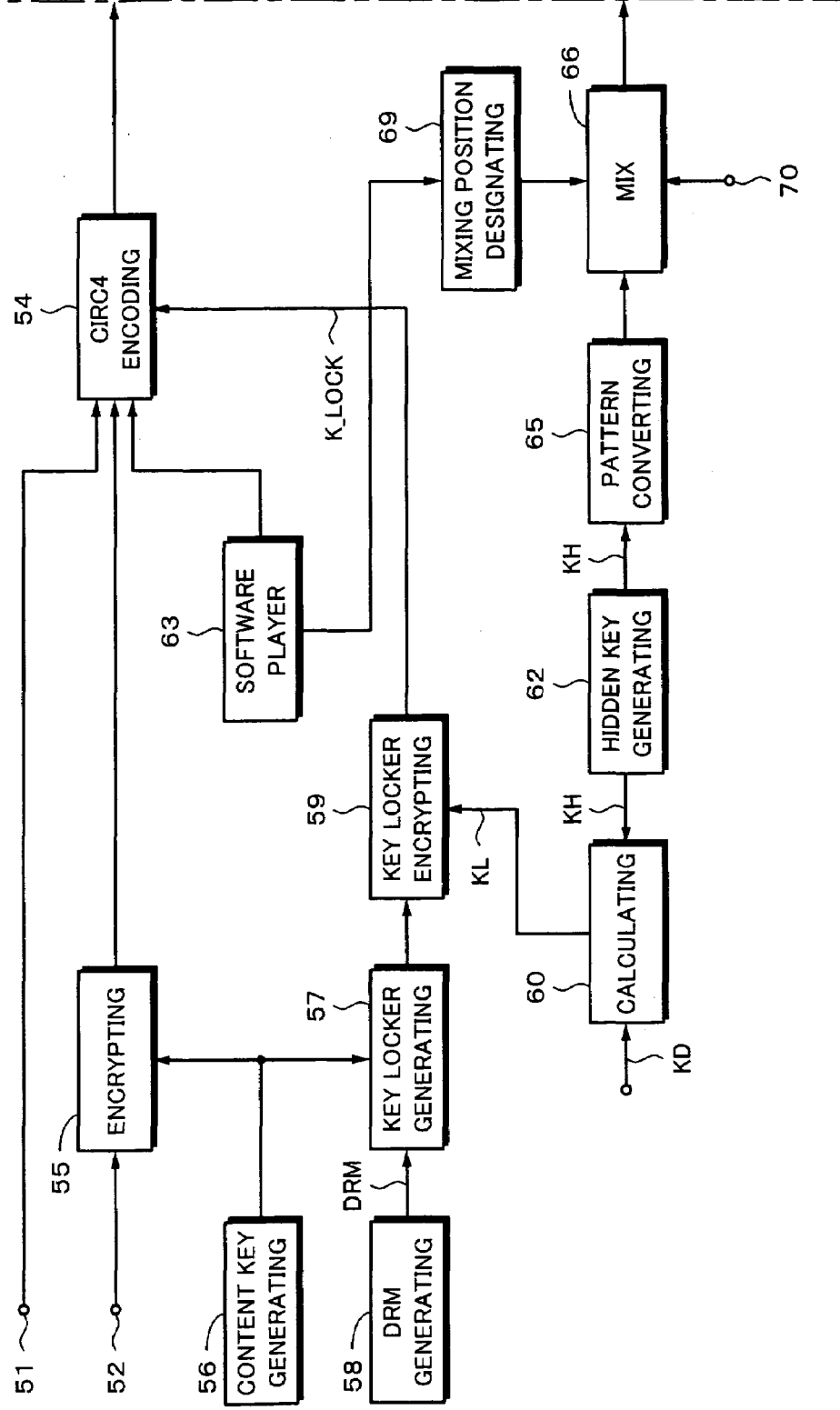
FIG. 14A and FIG. 14B are block diagrams showing an example of a recording apparatus for the optical disc according to the present invention.
Figure 14B:
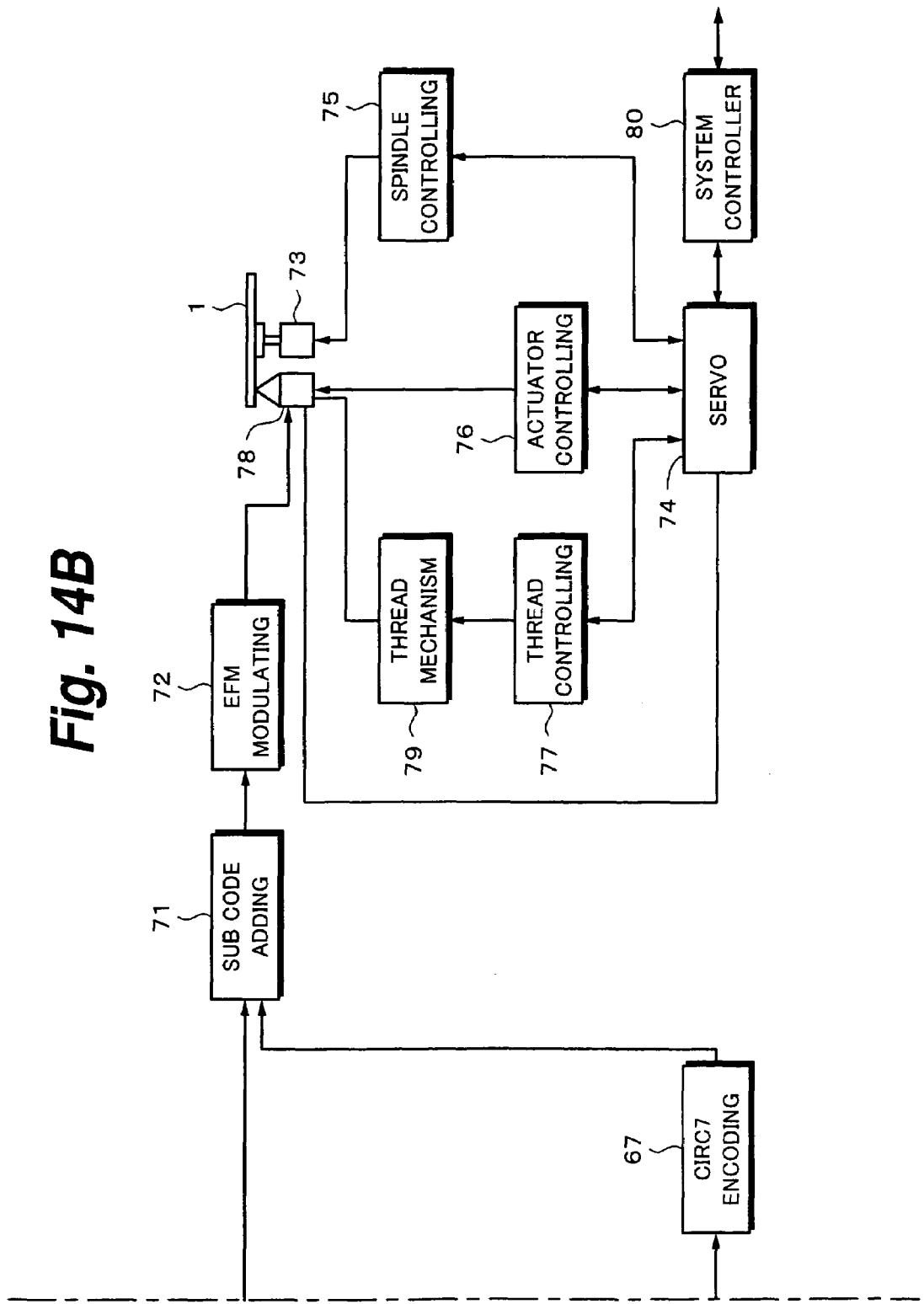

FIG. 14A and FIG. 14B show a structure of a recording apparatus that creates data that is recorded on the forgoing optical disc 1.

In FIG. 14A and FIG. 14B, digital audio data as content data to be recorded in the program area Pa1 is supplied to an input terminal 51.

Content data to be recorded in the program area PA2 is supplied to an input terminal 52. The content data is digital audio data that has been compressed according to for example the ATRAC3.

The content data, which has been input from the input terminal 52, is supplied to an encrypting circuit 55. Content key data KC is supplied from a content key generating circuit 56 to the encrypting circuit 55. The encrypting circuit 55 encrypts the content data with the content key data KC supplied from the content key generating circuit 56. The encrypted content data is supplied to an error correction code encoding circuit 54. The error correction code encoding circuit 54 performs an error correction code encoding process according to the CIRC4 system.

The content key data KC supplied from the content key generating circuit 56 is supplied to the encrypting circuit 55. In addition, the content key data KC is supplied to a key locker data generating circuit 57. A DRM generating circuit 58 generates copyright management data DRM about the content data. The copyright management data represents for example permission or prohibition of reproducing operation of content data, permission or prohibition of copy operation of content data, and permission of copy operation of one generation or multiple generations of content data.

The key locker data generating circuit 57 encodes the content key data KC and the copyright management data DRM and generates key locker data.

Output data of the key locker data generating circuit 57 is supplied to a key locker data encrypting circuit 59. The key locker data key KL is supplied from a hash calculating circuit 60 to the key locker data encrypting circuit 59. The key locker data generated by the key locker data generating circuit 57 is encrypted by the key locker data encrypting circuit 59 with the key locker data key KL supplied from the hash calculating circuit 60.

The hash calculating circuit 60 generates the key locker data key KL with device key data KD and hidden key data KH.

In other words, the device key data KD is supplied from an input terminal 61 to the hash calculating 60. In addition, hidden key data KH is supplied from a hidden key data generating circuit 62 to the hash calculating 60. The device key data KD is stored as intrinsic data somewhere in the device. The hidden key data KH is generated by the hidden key data generating circuit 62 using random numbers.

The hash calculating circuit 60 performs a hash calculation with the device key data KD supplied from the input terminal 61 and the hidden key data KH supplied from the hidden key data generating circuit 62 and generates the key locker data key KL. The key locker data key KL is supplied to the key locker data encrypting circuit 59.

The key locker data encrypting circuit 59 encrypts key locker data data generated by the key locker data generating circuit 57 with the key locker data key KL supplied from the hash calculating circuit 60. The encrypted key locker data K_LOCK is supplied to an error correction code encoding circuit 54 according to the CIRC4 system.

A software player generating circuit 63 generates data of the software player SFT1 as program data for decrypting encrypted data. The data of the software player SFT1 is supplied to the error correction code encoding circuit 54 according to the CIRC4 system.

The error correction code encoding circuit 54 according to the CIRC4 system dually performs an error correction code encoding process for the C1 sequence (in the vertical direction) and the C2 sequence (in the diagonal direction). According to the CIRC4 system, the delay unit D is (D=4 frames) and the maximum delay amount is 27D (=108 frames).

On the other hand, the hidden key data KH supplied from the hidden key data generating circuit 62 is supplied to a CIRC4/CIRC7 pattern converting circuit 65. The CIRC4/CIRC7 pattern converting circuit 65 converts information of the hidden key data KH supplied from the hidden key data generating circuit 62 into data that can be decoded according to any one of the CIRC4 system and the CIRC7 system. The data that can be decoded according to any one of the CIRC4 system and the CIRC7 system is data of which predetermined data is repeated as one unit in the vertical direction (C1 sequence) in the case that data is two-dimensionally arrayed. An output of the CIRC4/CIRC7 pattern converting circuit 65 is supplied to an mixing circuit 66.

Other data to be recorded in the area AR2 is supplied from an input terminal 70 to the mixing circuit 66. Data to be recorded in the area AR2 may be any type of data. For example, the data to be recorded in the area AR2 may be data that can be reproduced by a device that has a decoder according to the CIRC7 system.

The mixing circuit 66 mixes the data supplied from the input terminal 70 and the information of the hidden key data KH supplied from the CIRC4/CIRC7 pattern converting circuit 65 at a predetermined position. The position at which the data supplied from the input terminal 69 and the hidden key data KH supplied from the CIRC4/CIRC7 pattern converting circuit 65 are mixed is designated by a mixing position designating circuit 69 corresponding to a position described in the software player SFT1.

An output of the mixing circuit 66 is supplied to an error correction code encoding circuit 67 according to the CIRC7 system. The error correction code encoding circuit 67 according to the CIRC7 system dually performs an error correction code encoding process for the C1 sequence (in the vertical direction) and the C2 sequence (in the diagonal direction). According to the CIRC7 system, the delay unit D is (D=7 frames) and the maximum delay amount is 27D (=189 frames).

Outputs of the error correction code encoding circuit 54 according to the CIRC4 system and the error correction code encoding circuit 67 according to the CIRC7 system are supplied to a sub code adding circuit 71. An output of the sub code adding circuit 71 is supplied to a modulating circuit 72. The modulating circuit 72 EFM-modulates record data.

The optical disc 1 is held on a turn table (not shown) and rotated by a spindle circuit 73. The rotations of the spindle motor 73 are driven at constant linear velocity (CLV) or constant angular velocity (CAV) by a spindle controlling circuit 75 under the control of a servo controlling circuit 74.

The servo controlling circuit 74 generates a focus error signal, a tracking error signal, and various types of servo drive signals such as a focus servo drive signal, a tracking servo drive signal, a thread servo drive signal, and a spindle servo drive signal corresponding to an operation command received from a system controller 80 and outputs the generated signals to the actuator controlling circuit 76, a thread controlling circuit 77, and the spindle controlling circuit 75.

An optical pickup 78 is a mechanism that focus a laser beam of a semiconductor laser as a light source on a signal surface of the optical disc 1 and. scans tracks formed in a concentric circle shape or a spiral shape on the optical disc 1. The laser beam radiated from the optical pickup 78 scans tracks corresponding to a surface deviation and eccentricity of the optical disc 1 as the an objective lens supported by an actuator is traveled in the focus direction and the tracking direction. An actuator is controlled by an actuator 76 under the control of the servo controlling circuit 74. The entire optical pickup 78 can be traveled by a thread mechanism 79 in the radial direction of the disc. The traveling of the thread mechanism 79 is controlled by the thread controlling circuit 77 under the control of the servo controlling circuit 74.

Output data of the modulating circuit 72 is supplied to the optical pickup 78. The optical pickup 78 outputs a laser beam whose waveform has been modulated corresponding to the output data of the modulating circuit 72. The laser beam is radiated on the record surface of the optical disc 1 and information is recorded on the optical disc 1.

When digital audio data is recoded in the program area Pa1 of the optical disc 1, the digital audio data supplied from the input terminal 51 is supplied to the error correction code encoding circuit 54 according to the CIRC4 system. The error correction code encoding circuit 54 performs an error correction code encoding process for the digital audio data according to the CIRC4 system. Output data of the error correction code encoding circuit 54 is supplied to the optical pickup 78 through the sub code adding circuit 71 and the modulating circuit 72 and recorded on the optical disc 1.

When encrypted content data is recorded in the program area PA2 of the optical disc 1, the content data supplied from the input terminal 52 is encrypted by the encrypting circuit 55. The content data encrypted by the encrypting circuit 55 is supplied to the error correction code encoding circuit 54 according to the CIRC4 system. The error correction code encoding circuit 54 performs an error correction code encoding process for the content data according to the CIRC4 system. Output data of the error correction code encoding circuit 54 is supplied to the optical pickup 78 through the sub code adding circuit 71 and the modulating circuit 72 and recorded on the optical disc 1.

The content key data KC with which the content data is encrypted is generated by the content key generating circuit 56. The content key data KC is encoded along with the copyright management data DRM supplied from the DRM generating circuit 58 by the key locker data generating circuit 57. As a result, key locker data is generated. The key locker data is encrypted with the key locker data key KL by the key locker data encrypting circuit 59. The encrypted key locker data K_LOCK is supplied to the error correction code encoding circuit 54 according to the CIRC4 system. Output data of the error correction code encoding circuit 54 is supplied to the optical pickup 78 through the sub code adding circuit 71 and the modulating circuit 72 and recorded on the optical disc 1.

When data of the software player SFT1 is recorded in the program area PA2 of the optical disc 1, the data of the software player SFT1 is output from the software player generating circuit 63 and supplied to the error correction code encoding circuit 54 according to the CIRC4 system. Output data of the error correction code encoding circuit 54 is supplied to the optical pickup 78 through the sub code adding circuit 71 and the modulating circuit 72 and recorded on the optical disc 1.

When data is recorded in the area AR2 of the program area PA2 of the optical disc 1, data supplied from the input terminal 70 is supplied to the error correction code encoding circuit 67 according to the CIRC7 system through the mixing circuit 66. The CIRC4/CIRC7 pattern converting circuit 65 supplies the hidden key data KH that can be decoded according to any one of the CIRC4 system and the CIRC7 system to the mixing circuit 66.

A recording position of the hidden key data KH in the area AR2 is described in the software player SFT1 supplied from the software player generating circuit 63. The mixing position designating circuit 69 mixes the data supplied from the input terminal 68 and the hidden key data KH corresponding to the recording position described in the software player SFT1.

An output of the mixing circuit 66 is supplied to the error correction code encoding circuit 67 according to the CIRC7 system. The error correction code encoding circuit 67 performs an error correction code encoding process for the digital audio data according to the CIRC7 system.

Output data of the error correction code encoding circuit 67 is supplied to the optical pickup 78 through the sub code adding circuit 71 and the modulating circuit 72 and recorded on the optical disc 1.

FIG. 15A and FIG. 15B show a structure of a reproducing apparatus that reproduces data from the optical disc 1.

The reproducing apparatus is a conventional player or a conventional drive that performs a decrypting process for encrypted content by software. Thus, various key reproducing circuits, a key locker data reproducing circuit, and a content data decoding circuit are implemented by software. In this example, their functions are described with reference to block diagrams of FIG. 15A and FIG. 15B. Of course, those processes may be implemented by hardware.

In FIG. 15A and FIG. 15B, the optical disc 1 is held on a turn table (not shown) and rotated by a spindle motor 81. The rotations of the spindle motor 81 are driven at constant linear velocity (CLV) or constant angular velocity (CAV) by a spindle controlling circuit 82 under the control of a servo controlling circuit 83.

The servo controlling circuit 83 generates a focus error signal, a tracking error signal, and various types of servo drive signals such as a focus servo drive signal, a tracking servo drive signal, a thread servo drive signal, and a spindle servo drive signal corresponding to an operation command supplied from a system controller 80 and outputs the generated signals to an actuator controlling circuit 84, a thread controlling circuit 85, and the spindle controlling circuit 82. An optical pickup 87 is a mechanism that focuses a laser beam of a semiconductor laser as a light source on a signal surface of the optical disc 1 and scans tracks formed in a concentric circular shape or a spiral shape on the optical disc 1. The entire optical pickup 87 is traveled in the radial direction of the optical disc 1 by a thread mechanism 88.

An output signal of the optical pickup 87 is supplied to a demodulating circuit 90 through an RF amplifier 89. The demodulating circuit 90 EFM-demodulates the signal supplied from the optical pickup 87. Output data of the demodulating circuit 90 is supplied to a sub code extracting circuit 91. The sub code extracting circuit 90 extracts sub code data from the data supplied from the demodulating circuit 90. Output data of the sub code extracting circuit 90 is supplied to an error correcting circuit 92. The error correcting circuit 92 performs an error correcting process according to the CIRC4 system.

When CD-DA data is reproduced from the program area Pa1 of the optical disc 1, the optical pickup 87 accesses the program area Pa1 and reads data therefrom. An output signal of the optical pickup 87 is supplied to the error correcting circuit 92 through the RF amplifier 89, the demodulating circuit 90, and the sub code extracting circuit 91. The error correcting circuit 92 performs an error correcting process according to the CIRC4 system. The error correcting circuit 92 outputs audio data. The audio data is output from an output terminal 94 through a switching circuit 93.

Content data in the program area PA2 of the optical disc 1 has been encrypted. Thus, when the content data in the program area PA2 is reproduced, it is necessary to decrypt the content data.

When the content data in the program area PA2 is reproduced, the optical pickup 87 accesses the beginning of data of the area of the software player SFT1 in the program area PA2. Thus, the data in the software player SFT1 is supplied to the error correcting circuit 92 through the RF amplifier 89, the demodulating circuit 90, and the sub code extracting circuit 91. The error correcting circuit 92 performs an error correcting process according to the CIRC4 system. The error correcting circuit 92 outputs data of the software player SFT1. The data of the software player is sent to a software player starting portion 95 through the switching circuit 93. The software player starting portion 95 determines a position of data that can be decoded according to any one of the CIRC4 system and the CIRC7 system in the area AR2 corresponding to the data of the software player SFT1.

After the position of data that can be decoded according to any one of the CIRC4 system and the CIRC7 system in the area AR2 has been obtained corresponding to the data of the software player SFT1, the optical pickup 87 accesses the obtained position. The data that can be decoded according to any one of the CIRC4 system and the CIRC7 system is supplied to the error correcting circuit 92 through the RF amplifier 89, the demodulating circuit 90, and the sub code extracting circuit 91. Output data of the error correcting circuit 92 is supplied to a hidden key reproducing circuit 96. The hidden key reproducing circuit 96 reproduces the hidden key data KH.

The hidden key data KH that has been reproduced by the hidden key reproducing circuit 96 is supplied to a hash calculating circuit 97. Device key data KD that is intrinsic to the reproducing apparatus is supplied from an input terminal 104 to the hash calculating circuit 97. The hash calculating circuit 97 obtains the key locker data key KL with the hidden key data KH and the device key data KD. The key locker data key KL is supplied to a decrypting circuit 99.

In such a manner, after the key locker data key KL has been obtained, the optical pickup 87 is traveled to the position of the key locker data K_LOCK of the program area PA2. At the position, the key locker data K_LOCK is reproduced. An output signal corresponding to the key locker data K_LOCK is output from the optical pickup 87 and supplied to a key locker data reproducing circuit 98 through the RF amplifier 89, the demodulating circuit 90, the sub code extracting circuit 91, the error correcting circuit 92, and the switching circuit 93. An output of the key locker data reproducing circuit 98 is supplied to the decrypting circuit 99.

The decrypting circuit 99 decrypts the key locker data K_LOCK with the key locker data key KL supplied from the hash calculating circuit 97. Output data of the decrypting circuit 99 is supplied to a content key reproducing circuit 100. In addition, the output data of the decrypting circuit 99 is supplied to a copyright management data reproducing circuit 101. The content key reproducing circuit 100 extracts the content key data KC from the key locker data K_LOCK. The content key data KC is supplied to a decrypting circuit 102. The copyright management data reproducing circuit 101 extracts the copyright management data DRM from the key locker data K_LOCK. The copyright management data DRM is sent to the system controller 80.

In such a manner, after the key locker data K_LOCK has been read from the optical disc 1 and the content key data KC has been read from the key locker data K_LOCK, the optical pickup 87 is traveled to the position of the content data of the program area PA2. The optical pickup 87 reads the encrypted content data from the position. The optical pickup 87 outputs a signal corresponding to the encrypted content data. The output signal is supplied to the decrypting circuit 102 through the RF amplifier 89, the demodulating circuit 90, the sub code extracting circuit 91, the error correcting circuit 92, and the switching circuit 93. The decrypting circuit 102 performs a decrypting process for the encrypted content data with the content key data KC supplied from the content key reproducing circuit 100. The decrypted content data is output from an output terminal 103.

In the optical disc 1 according to the present invention, the hidden key data KH is recorded in the area AR2 in which the hidden key data KH has been encoded with the error correction code according to the CIRC7 system in such a manner that the data can be decoded according to any one of the CIRC7 system and the CIRC4 system. The recording position of the area AR2 is designated with data of the software player SFT1.

In the forgoing example, in the area AR2 in which data has been encoded with the error correction code according to the CIRC7 system, the hidden key data KH is recorded in such a manner that the data can be decoded according to any one of the CIRC7 system and the CIRC4 system. However, the data that is recorded in such a manner that it can be decoded according to any one of the CIRC7 system and the CIRC4 system is not limited to the hidden key data KH. Alternatively, the content key data KC or the key locker data key KL may be recorded.

Besides such key data, various types of data such as copyright management data and additional service data about disc and contents may be recorded in the area AR2 in such a manner that the data can be decoded according to any one of the CIRC7 system and the CIRC4 system.

In other words, in the area AR2, various types of data are recorded in such a manner that they can be decoded according to any one of the CIRC7 system and the CIRC4 system. The software player SFT1 is data that represents the recoding position of those types of data.

According to the present invention, the recoding position of data that has been recorded in such a manner that the data can be decoded according to any one of the CIRC7 system and the CIRC4 system is designated with the software player SFT1. However, the recording position may be designated by other than the software player SFT1.

In the forgoing example, as shown in FIG. 1 and FIG. 2, the optical disc is a two-session optical disc that is divided into an inner periphery area and an outer periphery area in which data of CD-DA and compressed audio data that is encrypted are recorded. However, as shown in FIG. 16, of course, the optical disc may be a one-session optical disc.

In the example shown in FIG. 16, a lead-in area LI is formed on the innermost periphery of the optical disc. A program area PA is formed on an outer periphery of the lead-in area LI. A lead-out area LO is formed outside the program area PA. The program area PA is divided into an area AR1 and an area AR2. In the area AR1, data that has been encoded with the error correction code according to the CIRC4 system is recorded. In the area AR2, key locker data K_LOCK2 and data of software player SFT1 are recorded. Moreover, in the area AR2, data that has been encoded with the error correction code according to the CIRC7 system is recorded. Furthermore, in the area AR2, data that can be decoded according to any one of the CIRC4 system and the CIRC7 system is recorded. The data contains the hidden key data KH.

In the forgoing example, data that can be decoded according to any one of the CIRC4 system and the CIRC7 system has been described. However, predetermined data repeated as one unit in the vertical direction (C1 sequence) can be decoded regardless of the interleave length.

In addition, data that can be decoded according to a plurality of error correction systems is not limited to data according to the CIRC system. In other words, another encoding system of which data can be encoded with error correction codes of two sequences can be considered. For example, in the case of a product code of which data is encoded in the horizontal direction and the vertical direction, like the CIRC, data that can be decoded with a plurality of error correction codes can be considered.

In the forgoing optical disc 1, in the area AR2, data that has been encoded with the error correction code according to the CIRC7 system contains data that can be decoded according to any one of the CIRC4 system and the CIRC7 system. However, when a portion that contains data that can be decoded according to any one of the CIRC4 system and the CIRC7 system is mistakenly reproduced as a sound, a uncomfortable sound will be generated. Thus, in the data, all high order bits of the PCM signal are set to 0 so that the level of the sound becomes low. Of course, when 1 represents a low level sound, all the high order bits are set to 1.

When a sound that is generated in a portion that can be decoded according to any one of the CIRC4 system and the CIRC7 system is a direct current (DC) or a radio frequency wave, since the user cannot easily recognize it, there is a risk of which he or she turns up the volume. Thus, data 0s and 1s in a predetermined pattern will be embedded in a portion that contains data that can be decoded according to any one of two systems. As a result, an audible band sound will be generated. For example, 0s and 1s will be repeated at 7.35 kHz.

In some decoding circuit according to the CIRC system, unless an error takes place in the C1 sequence, an error correction process is not performed for the C2 sequence. For a process of a drive or a player that has such a decoding circuit, in a part of the area AR2, data that can be decoded according to any one of the CIRC4 system and the CIRC7 system will contain an error of the C1 sequence.

According to the present invention, on a optical disc used as a data recoding medium, data that has been encoded with a plurality of (at least two) error correction codes is recorded. For example, in an area in which data that has been encoded with the error correction code according to the CIRC4 system is recorded, an area in which data is encoded with the error correction code according to the CIRC7 system is formed. In the area, data that can be decoded according to any one of the CIRC4 system and the CIRC7 system is recorded.

When data of such an optical disc is decoded by a decoding circuit according to the CIRC4 system and disc-copied, since an error that cannot be corrected takes place in an area in which data is encoded with the error correction code according to the CIRC7 system, the data of the optical disc cannot be copied. Even if the data of the optical disc can be copied, the data is rewritten. When a part of key data is recorded in data that can be decoded according to any one of the CIRC4 system and the CIRC7 system, the security of the key data is improved.

INDUSTRIAL UTILIZATION

As described above, the present invention is a data recording medium such as a CD on which content data is encrypted and recorded, a recording method and apparatus for recording data on such a data recording medium, and a data reproducing method and apparatus for reproducing data from such a data recoding medium that are suitable for protecting content data.

The invention claimed is:

1. A recording medium comprising:
at least one piece of first data recorded in a first area and that has been encoded with a first error correction code;
at least one piece of second data recorded in a second area and that has been encoded with a second error correction that is different from the first error connection code; and
at least one piece of third data recorded in the second area and that can be decoded with the first error correction code and that can be decoded with the second error correction code.

2. The recording medium as set forth in claim 1, wherein the first error correction code and the second error correction code are used to encode at least two encoding sequences in respective directions, the first error correction code and the second error correction being different only in the encoding sequences, the at least one piece of third data that can be decoded being data of which predetermined data is repeated as one unit of one of the two encoding sequences in the respective directions.

3. The recording medium as set forth in claim 1, wherein the first error correction code and the second error correction code are a code with which a C1 sequence in a vertical direction is encoded and a code with which a C2 sequence in a diagonal direction is encoded, respectively, the first error correction code and the second error correction code being different in their interleave lengths, the at least one piece of third data that can be decoded being predetermined data repeated as one unit of the C1 sequence.

4. The recording medium as set forth in claim 3, wherein the at least one piece of third data that can be decoded contains an error of the C1 sequence.

5. The recording medium as set forth in claim 3, wherein the at least one piece of third data that can be decoded has been recorded in such a manner that all high order bits have the same values.

6. The recording medium as set forth in claim 3,
wherein the at least one piece of third data that can be decoded has been recorded in such a manner that when the at least one piece of third data is reproduced, an audible band sound is generated.

7. The recording medium as set forth in claim 6,
wherein the at least one piece of third data that can be decoded has been recorded in such a manner that data 0s and is are repeated 1n a predetermined period.

8. The recording medium as set forth in claim 1,
wherein data that represents a recording position of the at least one piece of third data that can be reproduced is recorded on the recording medium.

9. The recording medium as set forth in claim 8,
wherein when the at least one piece of first data that has been encoded with the first error correction code is recorded, the data is encrypted, and
wherein the at least one piece of third data that can be decoded contains data used to decode the at least one piece of first data that has been encoded with the first error correction code and encrypted.

10. A recording method for a recording medium, comprising:
recording at least one piece of first data in a first area and that has been encoded with a first error correction code;
recording at least one piece of second data in a second area and that has been encoded with a second error correction code that is different from the first error correction code; and
recording at least one piece of third data in the second area and that can be decoded with the first error correction code and that can be decoded with the second error correction code.

11. The recording method for the recording medium as set forth in claim 10, further comprising:
performing an encoding process including an error correction code encoding process for the input data with the first error correction code and recording the encoded input data on the recording medium,
wherein the recording the at least one piece of third is performed by converting the data into data that can be decoded with any one of the first error correction code and the second error correction code and generating the data that can be decoded.

12. The recording method for the recording medium as set forth in claim 11,
wherein the recording the at least one piece of third is performed by converting the data into data that can be decoded with any one of the first error correction code and the second error correction code, encoding the converted data with the second error correction code, and recording the encoded data on the recording medium.

13. The recording method for the recording medium as set forth in claim 10,
wherein the recording medium has a lead-in area, a data recording area including the first and second areas, and a lead-out area, and
wherein the at least one piece of first data that has been encoded with the first error correction code and the at least one piece of third data that can be decoded are recorded in the data recording area.

14. The recording method for the recording medium as set forth in claim 10,
wherein the first error correction code and the second error correction code are used to encode at least two encoding sequences in respective directions, the first error correction code and the second error correction being different only in the encoding sequences, the at least one piece of third data that can be decoded being data of which predetermined data is repeated as one unit of one of the two encoding sequences in the respective directions.

15. The recording method for the recording medium as set forth in claim 10,
wherein the first error correction code and the second error correction code are a code with which a C1 sequence in a vertical direction is encoded and a code with which a C2 sequence in a diagonal direction is encoded, respectively, the first error correction code and the second error correction code being different in their interleave lengths, the at least one piece of third data that can be decoded being predetermined data repeated as one unit of the C1 sequence.

16. The recording method for the recording medium as set forth in claim 15,
wherein the at least one piece of third data that can be decoded contains an error of the C1 sequence.

17. The recording method for the recording medium as set forth in claim 15,
wherein the at least one piece of third data that can be decoded has been recorded in such a manner that all high order bits have the same values.

18. The recording method for the recording medium as set forth in claim 15,
wherein the at least one piece of third data that can be decoded has been recorded in such a manner that when the at least one piece of third data is reproduced, an audible band sound is generated.

19. The recording method for the recording medium as set forth in claim 18,
wherein the at least one piece of third data that can be decoded has been recorded in such a manner that data 0s and 1s are repeated in a predetermined period.

20. The recording method for the recording medium as set forth in claim 10, further comprising:
recording data that represents a recording position of the data that can be reproduced on the recording medium.

21. The recording method for the recording medium as set forth in claim 20, further comprising:
performing an encrypting process for the input data; and
encoding the encrypted data with the first error correction code,
wherein the at least one piece of third data that can be decoded contains data used to decode the data that has been encoded with the first error correction code and encrypted.

22. A recording apparatus for a recording medium, comprising:
an encoding process portion for performing an encoding process including an error correction code encoding process for input data with a first error correction code and with a second error correction code that is different from the first error correction code;
a recording portion for recording first data of the encoding process portion with the first error correction code in a first area of the recording medium and recording second data of the encoding process with the second error correction code in a second area of the recording medium; and
a generating portion for generating third data that can be decoded with the first error correction code and that can be decoded with a second error correction code, the recording portion recording the third data in the second area of the recording medium.

23. The recording apparatus for the recording medium as set forth in claim 22, further comprising:
an error correction code encoding process portion for performing an error correction code encoding process for the output data of the generating portion with the second error correction code.

24. The recording apparatus for the recording medium as set forth in claim 22,
wherein the recording medium has a lead-in area, a data recording area including the first and second areas, and a lead-out area, and
wherein the recording portion is configured to record the output data of the encoding process portion to the data recording area.

25. The recording apparatus for the recording medium as set forth in claim 22,
wherein the first error correction code and the second error correction code are used to encode at least two encoding sequences in respective directions, the first error correction code and the second error correction being different only in the encoding sequences, the third data that can be decoded being data of which predetermined data is repeated as one unit of one of the two encoding sequences in the respective directions.

26. The recording apparatus for the recording medium as set forth in claim 25,
wherein the first error correction code and the second error correction code are a code with which a C1 sequence in a vertical direction is encoded and a code with which a C2 sequence in a diagonal direction is encoded, respectively, the first error correction code and the second error correction code being different in their interleave lengths, the third data that can be decoded being predetermined data repeated as one unit of the C1 sequence.

27. The recording apparatus for the recording medium as set forth in claim 22,
wherein the generating portion is configured to receive data that represents a recording position of the third data that can be decoded on the recording medium.

28. The recording apparatus for the recording medium as set forth in claim 22, further comprising:
an encoding process portion for performing an encrypting process for the input data and supplying the encrypted data to the encoding process portion,
wherein the generating portion is configured to receive data with which the encrypted data received from the encrypting process portion is decrypted.

29. A reproducing apparatus for a recording medium, comprising:
a head portion for reading data from the recording medium including at least one piece of first data recorded in a first area that has been encoded with a first error correction code, at least one piece of second data recorded in a second area and that has been encoded with a second error correction code that is different from the first error correction code, and at least one piece of third data recorded in the second area and that can be decoded with the first error correction code and the second error correction code;
a decoding process portion for performing a decoding process including an error correction code decoding process for an output signal of the head portion with the first error correction code; and
a controlling portion for performing a control with the output data of the decoding process portion corresponding to the at least one piece of third data that can be decoded.

30. The reproducing apparatus for the recording medium as set forth in claim 29,
wherein the data that has been encoded with the first error correction code is encrypted and recorded on the recording medium,
wherein the at least one piece of third data that can be decoded contains data with which the at least one piece of first data that has been encoded with the first error correction code and encrypted is decoded, and
wherein the apparatus further comprises:
an extracting portion for extracting data with which the encrypted data is decoded from output data that is output from the decoding process portion and that can be decoded; and
a decrypting circuit portion for decrypting the encrypted data received from the decoding process portion with the data with which the encrypted data is decoded and that has been extracted from the extracting portion.

31. The reproducing apparatus for the recording medium as set forth in claim 29,
wherein data that represents a recoding position of the at least one piece of third data that can be decoded has been recorded on the recording medium, and
wherein the controlling portion is configured to control the head portion so as to read the data that represents the recording position from the recording medium and read the at least one piece of third data that can be decrypted with the data that represents the recording position.

32. The reproducing apparatus for the recording medium as set forth in claim 31,
wherein the at least one piece of first data that has been encoded with the first error correction code is encrypted and recorded on the recording medium,
wherein the at least one piece of third data that can be decoded contains data with which the at least one piece of first data that has been encoded with the first error correction code and encrypted is decoded, and
wherein the apparatus further comprises:
an extracting portion for extracting the data with which the encrypted data is decoded from data of which the data that can be decoded and that has been read from the recording medium is decoded by the decoding process portion; and
a decrypting circuit portion for decrypting the encrypted data received from the decoding process portion with the data with which the encrypted data is decoded and that has been extracted by the extracting portion.

33. The reproducing apparatus for the recording medium as set forth in claim 32, further comprising:
a first key data generating circuit portion for generating first key data with the data with which the encrypted data is decoded and that has been extracted by the extracting portion and key data that is intrinsic to the apparatus; and
a second key generating portion for generating second key data with the output data of the decoding process portion and supplying the generated second key data to the decrypting circuit portion.

34. The reproducing apparatus for the recording medium as set forth in claim 29,
wherein the first error correction code and the second error correction code are used to encode at least two encoding sequences in respective directions, the first error correction code and the second error correction being different only in the encoding sequences, the at least one piece of third data that can be decoded being data of which predetermined data is repeated as one unit of one of the two encoding sequences in the respective directions.

35. The reproducing apparatus for the recording medium as set forth in claim 34, wherein the first error correction code and the second error correction code are a code with which a C1 sequence in a vertical direction is encoded and a code with which a C2 sequence in a diagonal direction is encoded, respectively, the first error correction code and the second error correction code being different in their interleave lengths, the at least one piece of third data that can be decoded being predetermined data repeated as one unit of the C1 sequence.

36. A reproducing method for a recording medium, comprising:

reading data from the recording medium including at least one piece of first data recorded in a first area and that has been encoded with a first error correction code, at least one piece of second data recorded in a second area and that has been encoded with a second error correction code that is different from the first error correction code, and at least one piece of third data recorded in the second area and that can be decoded with the first error correction code and the second error correction code;

decoding including an error correction code decoding process for the read data with the first error correction code; and performing a control with the output data of which the decoding process has been performed corresponding to the at least one piece of third data that can be decoded.

37. The reproducing method for the recording medium as set forth in claim 36, wherein the at least one piece of first data that has been encoded with the first error correction code is encrypted and recorded on the recording medium, wherein the at least one piece of third data that can be decoded contains data with which the data that has been encoded with the first error correction code and encrypted is decoded, and wherein the method further comprises:

extracting data with which the encrypted data is decoded from output data for which the decoding process has been performed; and decrypting the encrypted output data for which the decoding process has been performed with the data with which the encrypted data is decoded and that has been extracted.

38. The reproducing method for the recording medium as set forth in claim 36, wherein data that represents a recoding position of the at least one piece of third data that can be decoded has been recorded on the recording medium, and wherein the method further comprises:

reading the data that represents the recording position from the recording medium; and reading the at least one piece of third data that can be decoded with the data that represents the recording position.

39. The reproducing method for the recording medium as set forth in claim 38, wherein the at least one piece of first data that has been encoded with the first error correction code is encrypted and recorded on the recording medium, wherein the at least one piece of third data that can be decoded contains data with which the data that has been encoded with the first error correction code and encrypted is decoded, and wherein the method further comprises:

extracting the data with which the encrypted data is decoded from the output data for which the decoding process has been performed; and decrypting the encrypted output for which the decoding process has been performed with the data with which the encrypted data is decoded and that has been extracted.

40. The reproducing method for the recording medium as set forth in claim 39, further comprising:

generating first key data with the data with which the encrypted data is decoded and that has been extracted and key data that is intrinsic to an apparatus for reproducing data from the recording medium;

generating second key data with the output data for which the decoding process has been performed; and decrypting the encrypted output data for which the decoding process has been performed with the generated second key data.

41. The reproducing method for the recording medium as set forth in claim 36, wherein the first error correction code and the second error correction code are used to encode at least two encoding sequences in respective directions, the first error correction code and the second error correction being different only in the encoding sequences, the at least one piece of third data that can be decoded being data of which predetermined data is repeated as one unit of one of the two encoding sequences in the respective directions.

42. The reproducing method for the recording medium as set forth in claim 41, wherein the first error correction code and the second error correction code are a code with which a C1 sequence in a vertical direction is encoded and a code with which a C2 sequence in a diagonal direction is encoded, respectively, the first error correction code and the second error correction code being different in their interleave lengths, the at least one piece of third data that can be decoded being predetermined data repeated as one unit of the C1 sequence.

* * * * *

UNITED STATES PATENT AND TRADEMARK OFFICE
CERTIFICATE OF CORRECTION

PATENT NO. : 7,151,733 B2
APPLICATION NO. : 10/467339
DATED : December 19, 2006
INVENTOR(S) : Yoichiro Sako et al.

Page 1 of 1

It is certified that error appears in the above-identified patent and that said Letters Patent is hereby corrected as shown below:

Column 10, line 37, change "cannot b" to --cannot be--.
Column 15, line 4, change "90" to --91--;
 line 9, change "Pa1" to --PA1--;
 line 10, change "Pa1" to --PA1--.
Column 10, line 9, change "is" to --1s--; same line change "1n" to --in--.

Signed and Sealed this

Third Day of July, 2007

JON W. DUDAS
*Director of the United States Patent and Trademark Office*